(12) United States Patent
Hikasa

(10) Patent No.: US 10,923,571 B2
(45) Date of Patent: Feb. 16, 2021

(54) SEMICONDUCTOR DEVICE SUPPRESSING ELECTRIC FIELD CONCENTRATION AND METHOD FOR MANUFACTURING

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/796,536

(22) Filed: Feb. 20, 2020

(65) Prior Publication Data

US 2020/0194561 A1 Jun. 18, 2020

Related U.S. Application Data

(63) Continuation of application No. 15/473,915, filed on Mar. 30, 2017, now Pat. No. 10,608,087.

(30) Foreign Application Priority Data

Mar. 31, 2016 (JP) .................................. 2016-071829

(51) Int. Cl.
*H01L 29/36* (2006.01)
*H01L 29/06* (2006.01)
(Continued)

(52) U.S. Cl.
CPC ............ *H01L 29/36* (2013.01); *H01L 21/265* (2013.01); *H01L 21/32* (2013.01); *H01L 21/324* (2013.01);
(Continued)

(58) Field of Classification Search
None
See application file for complete search history.

(56) References Cited

U.S. PATENT DOCUMENTS 7,586,161 B2 9/2009 Pfirsch
10,608,087 B2 * 3/2020 Hikasa ............... H01L 29/0615
(Continued)

FOREIGN PATENT DOCUMENTS

JP H09246570 9/1997
JP 2000101074 4/2000
(Continued)

OTHER PUBLICATIONS

Office Action issued for Japanese Patent Application No. 2016-071829, dated Nov. 14, 2019, 18 pages including English machine translation.

*Primary Examiner* — Robert K Carpenter
(74) *Attorney, Agent, or Firm* — Hamre, Schumann, Mueller & Larson, P.C

(57) ABSTRACT

A semiconductor device includes a semiconductor layer, having an active region, in which a functional element is formed, a first impurity region of a first conductivity type, formed at a surface layer portion of the semiconductor layer, a second impurity region of a second conductivity type, formed at a surface layer portion of the first impurity region and defining the active region, and a well region of the second conductivity type, formed along a periphery of the second impurity region at the surface layer portion of the first impurity region and having an inner side edge portion positioned at the second impurity region side, and an outer side edge portion positioned at an opposite side with respect to the second impurity region and having a second conductivity type impurity concentration lower than a second conductivity type impurity concentration of the inner side edge portion.

21 Claims, 18 Drawing Sheets

(51) Int. Cl.
*H01L 29/861* (2006.01)
*H01L 29/66* (2006.01)
*H01L 29/78* (2006.01)
*H01L 29/739* (2006.01)
*H01L 21/32* (2006.01)
*H01L 21/265* (2006.01)
*H01L 21/321* (2006.01)
*H01L 21/324* (2006.01)
*H01L 29/40* (2006.01)

(52) U.S. Cl.
CPC .... *H01L 21/32105* (2013.01); *H01L 29/0615* (2013.01); *H01L 29/0619* (2013.01); *H01L 29/0649* (2013.01); *H01L 29/0657* (2013.01); *H01L 29/66136* (2013.01); *H01L 29/66325* (2013.01); *H01L 29/66348* (2013.01); *H01L 29/7393* (2013.01); *H01L 29/7397* (2013.01); *H01L 29/7811* (2013.01); *H01L 29/7813* (2013.01); *H01L 29/8611* (2013.01); *H01L 29/0638* (2013.01); *H01L 29/402* (2013.01)

(56) References Cited

U.S. PATENT DOCUMENTS

| | | | | |
|---|---|---|---|---|
| 2013/0089970 A1* | 4/2013 | Amada | ............... | B24B 7/228 |
| | | | | 438/465 |
| 2013/0153954 A1 | 6/2013 | Takahashi | | |
| 2014/0008718 A1 | 1/2014 | Toyoda | | |

FOREIGN PATENT DOCUMENTS

| | | |
|---|---|---|
| JP | 2002231944 | 8/2002 |
| JP | 2003158258 | 5/2003 |
| JP | 2009016618 | 1/2009 |
| JP | 2010050147 | 3/2010 |
| JP | 2010147065 | 7/2010 |
| JP | 2010245281 | 10/2010 |
| JP | 2011071160 | 4/2011 |
| WO | 2012124786 | 9/2012 |

* cited by examiner

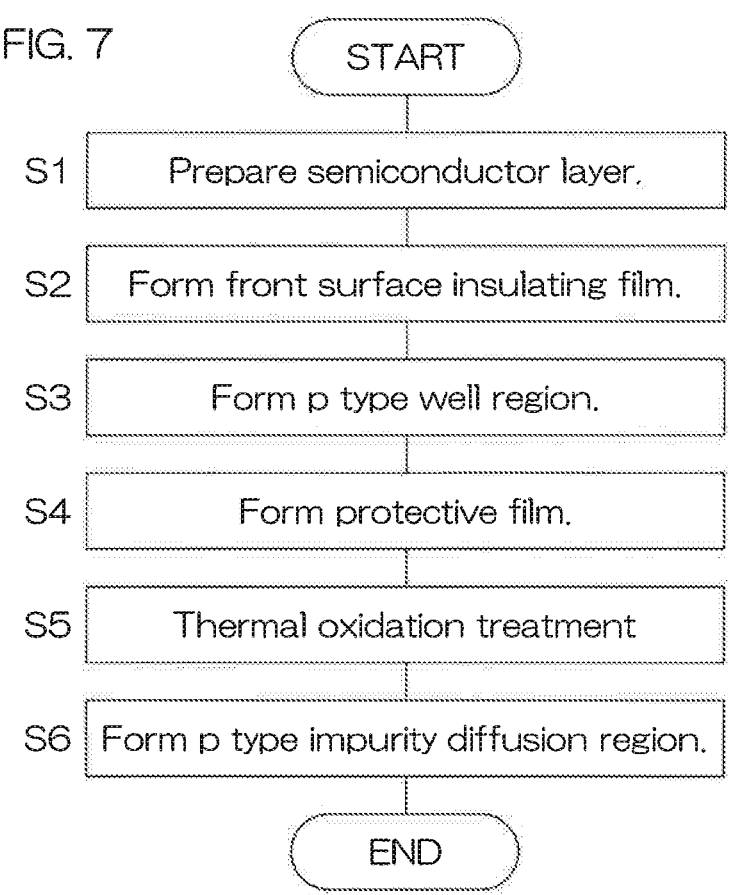

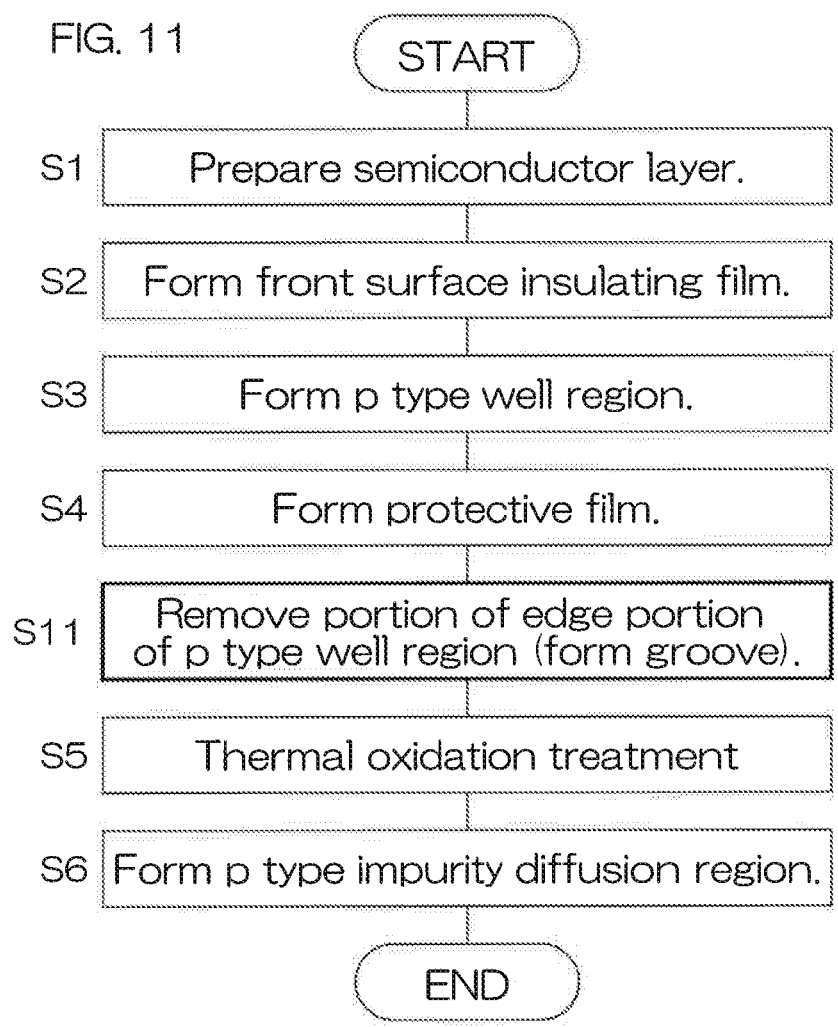

SEMICONDUCTOR DEVICE SUPPRESSING ELECTRIC FIELD CONCENTRATION AND METHOD FOR MANUFACTURING

BACKGROUND OF THE INVENTION

1. Field of the Invention

The present invention relates to a semiconductor device and a method for manufacturing the same.

2. Description of the Related Art

A semiconductor device, including an n type semiconductor layer, a p type base layer, formed at a surface layer portion of the semiconductor layer and defining an active region, and a p type well layer, formed along a periphery of the base layer at the surface layer portion of the semiconductor layer, is disclosed in JP2003-158258A.

SUMMARY OF THE INVENTION

A preferred embodiment of the present invention provides a semiconductor device, including a semiconductor layer, having an active region, in which a functional element is formed, a first impurity region of a first conductivity type, formed at a surface layer portion of the semiconductor layer, a second impurity region of a second conductivity type, formed at a surface layer portion of the first impurity region and defining the active region, and a well region of the second conductivity type, formed along a periphery of the second impurity region at the surface layer portion of the first impurity region and having an inner side edge portion positioned at the second impurity region side, and an outer side edge portion positioned at an opposite side with respect to the second impurity region and having a second conductivity type impurity concentration lower than a second conductivity type impurity concentration of the inner side edge portion.

A preferred embodiment of the present invention provides a method for manufacturing a semiconductor device, including a step of preparing a semiconductor layer, having a first impurity region of a first conductivity type formed at a surface layer portion, a step of setting an active region, in which a functional element is to be formed, in the semiconductor layer and introducing a second conductivity type impurity in a surface layer portion of the first impurity region so that the second conductivity type impurity is introduced along a peripheral edge of the active region to form a well region of the second conductivity type, a step of performing an oxidation treatment to form an oxide film, which exposes an inner side edge portion positioned at the active region side in the well region, and covers an outer side edge portion positioned at an opposite side with respect to the active region in the well region, and a step of introducing a second conductivity type impurity in the surface layer portion of the first impurity region in the active region to form a second impurity region of the second conductivity type that defines the active region.

The above and other objects, features, and effects of the present invention shall be made clear by the following description of preferred embodiments with reference to the attached drawings.

BRIEF DESCRIPTION OF THE DRAWINGS

FIG. 7 is a flowchart of an example of a method for manufacturing the semiconductor device of FIG. 1.

FIG. 11 is a flowchart of an example of a method for manufacturing the semiconductor device of FIG. 9.

DETAILED DESCRIPTION OF THE PREFERRED EMBODIMENTS

Figure 1:
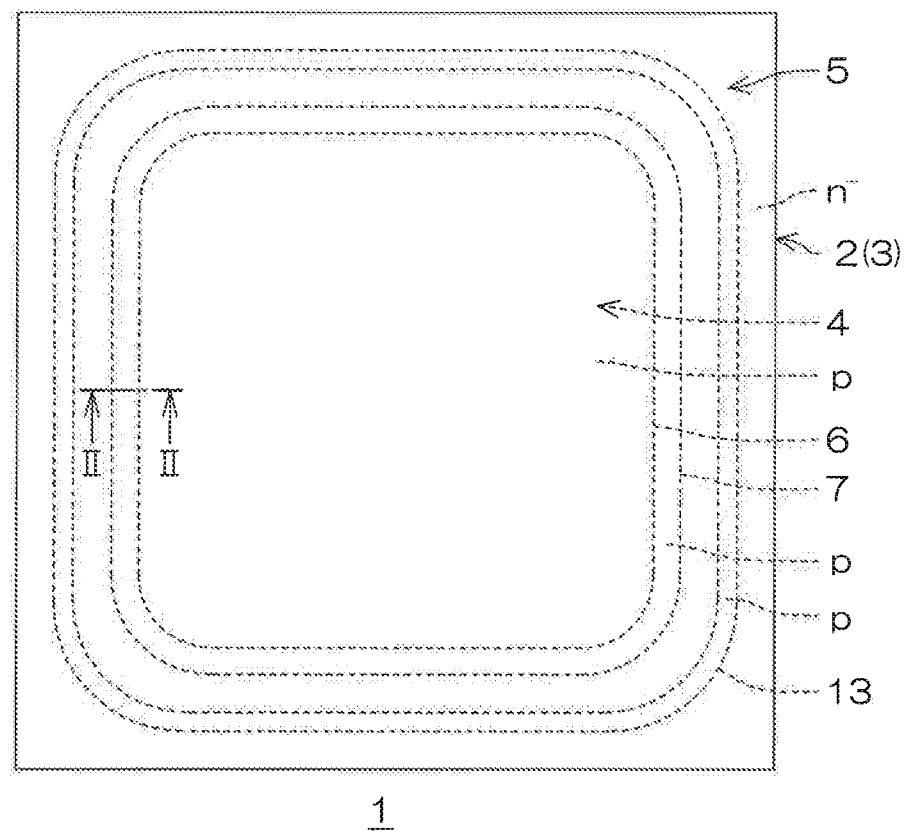
FIG. 1 is a plan view of a semiconductor device according to a first preferred embodiment of the present invention.

According to a semiconductor device having a structure such as that disclosed in JP2003-158258A, in a well region, an electric field concentrates to an edge portion positioned at an opposite side with respect to the active region. The occurrence of such electric field concentration causes lowering of a withstand voltage of the semiconductor device.

A preferred embodiment of the present invention thus provides a semiconductor device, having a structure that enables improvement of the withstand voltage, and a method for manufacturing a semiconductor device of such structure.

A preferred embodiment of the present invention provides a semiconductor device, including a semiconductor layer, having an active region, in which a functional element is formed, a first impurity region of a first conductivity type, formed at a surface layer portion of the semiconductor layer, a second impurity region of a second conductivity type, formed at a surface layer portion of the first impurity region and defining the active region, and a well region of the second conductivity type, formed along a periphery of the second impurity region at the surface layer portion of the first impurity region and having an inner side edge portion positioned at the second impurity region side, and an outer side edge portion positioned at an opposite side with respect to the second impurity region and having a second conductivity type impurity concentration lower than a second conductivity type impurity concentration of the inner side edge portion.

According to the semiconductor device, the second conductivity type impurity concentration of the outer side edge portion of the well region is lower than the second conductivity type impurity concentration of the inner side edge portion of the well region. The electric field concentration to the outer side edge portion of the well region can thus be suppressed. A semiconductor device that enables improvement of the withstand voltage can thus be provided.

A preferred embodiment of the present invention provides a method for manufacturing a semiconductor device, including a process of preparing a semiconductor layer, having a first impurity region of a first conductivity type formed at a surface layer portion, a process of setting an active region, in which a functional element is to be formed, in the semiconductor layer and introducing an impurity of a second conductivity type in a surface layer portion of the first impurity region so that the impurity of the second conductivity type is introduced along a peripheral edge of the active region to form a well region of a second conductivity type, a process of performing an oxidation treatment to form an oxide film, which, in the well region, exposes an inner side edge portion positioned at the active region side and covers an outer side edge portion positioned at an opposite side with respect to the active region, and a process of introducing a second conductivity type impurity in a surface layer portion of the first impurity region in the active region to form a second impurity region of the second conductivity type that defines the active region.

According to the method for manufacturing the semiconductor device, the oxide film is formed on a surface of the semiconductor layer by the oxidation treatment. In this process, the oxide film absorbs the second conductivity type impurity from the outer side edge portion of the well region at the same time as the formation of the oxide film. The second conductivity type impurity concentration of the outer side edge portion of the well region thus becomes lower than the second conductivity type impurity concentration of the inner side edge portion of the well region. The electric concentration to the outer side edge portion of the well region can thus be suppressed and a semiconductor device that enables improvement of the withstand voltage can thus be manufactured and provided.

Preferred embodiments of the present invention shall now be described in detail with reference to the attached drawings.

FIG. 1 is a plan view of a semiconductor device 1 according to a first preferred embodiment of the present invention.

Referring to FIG. 1, the semiconductor device 1 includes an n⁻ type semiconductor layer 2. The semiconductor layer 2 may be an FZ substrate made of a silicon monocrystal formed by an FZ (Floating Zone) method. The semiconductor layer 2 is formed in a quadrilateral shape in a plan view as viewed from a normal direction of a front surface of the semiconductor layer 2 (hereinafter referred to simply as "plan view").

An active region 4 and an outer side region 5 are set in the semiconductor layer 2. The active region 4 is a region in which a functional element is formed. The active region 4 is also called an element forming region. With the present preferred embodiment, an example where a diode is formed as the functional element in the active region 4 shall be described.

In the present preferred embodiment, the active region 4 is set at a central portion of the semiconductor layer 2. The active region 4 is set to a quadrilateral shape in plan view that has four sides parallel to respective sides of the semiconductor layer 2. The active region 4 is set at an inner side of the semiconductor layer 2 across intervals from peripheral edges of the semiconductor layer 2.

The outer side region 5 is set in a region outside the active region 4. In the present preferred embodiment, the outer side region 5 is set to an endless shape (quadrilateral annular shape in plan view) that surrounds the active region 4 in a region between the peripheral edges of the semiconductor layer 2 and peripheral edges of the active region 4.

Figure 2:
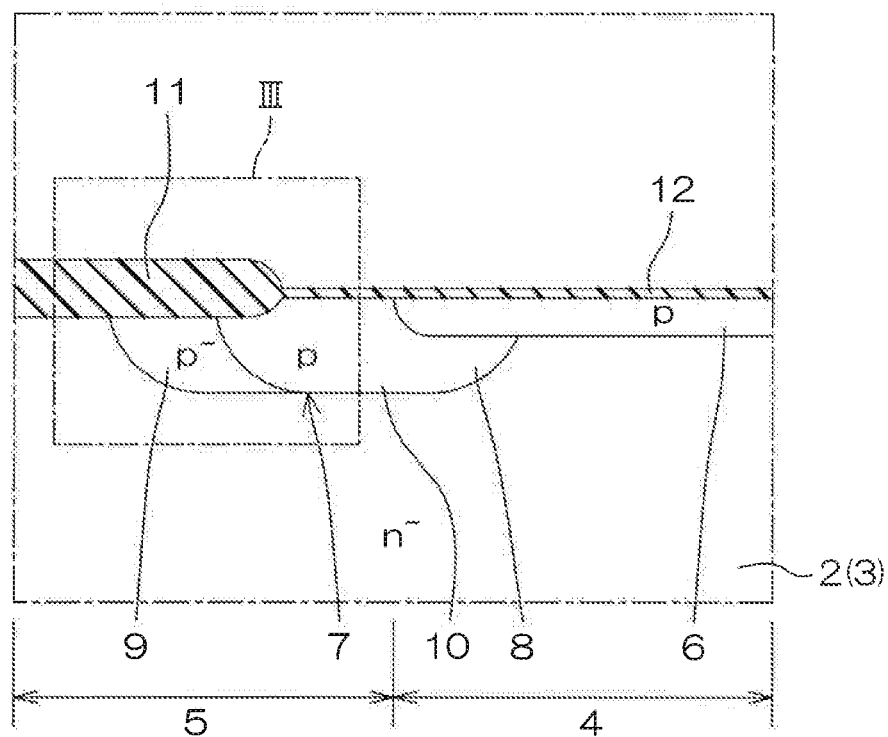
FIG. 2 is a sectional view taken along line II-II of FIG. 1.
Figure 3:
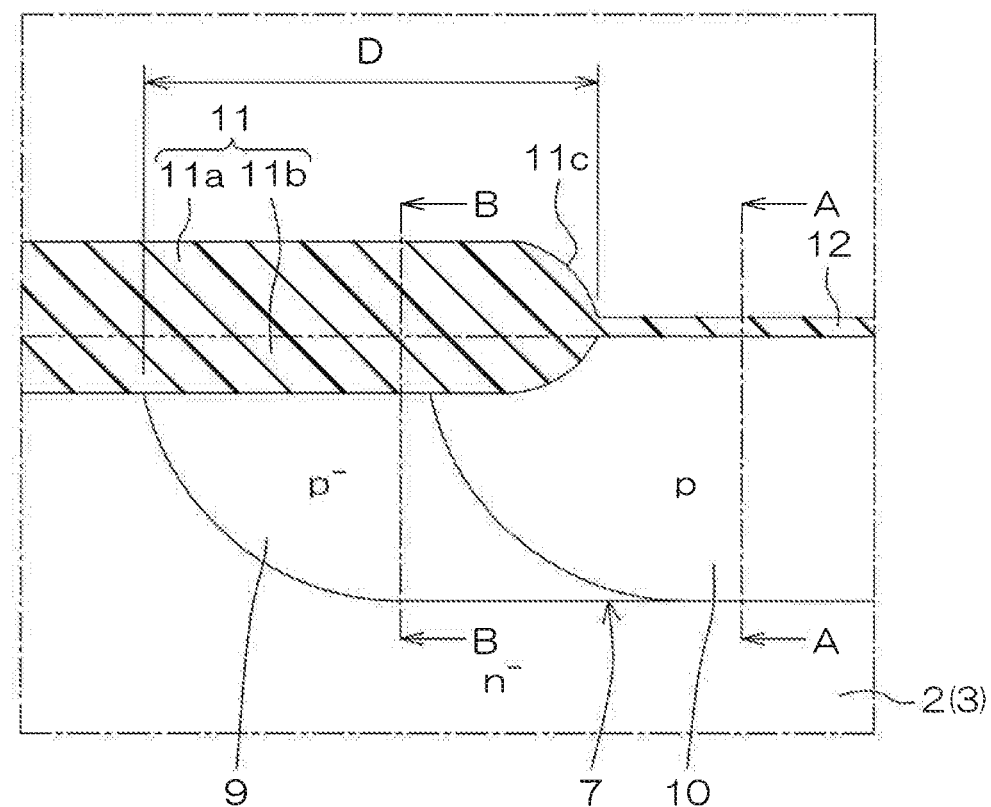
FIG. 3 is an enlarged view of a region III of FIG. 2.

FIG. 2 is a sectional view taken along line II-II of FIG. 1. FIG. 3 is an enlarged view of a region III of FIG. 2.

Referring to FIG. 2, an n⁻ type impurity region 3 is formed across an entirety of the semiconductor layer 2. The n⁻ type impurity region 3 is formed using the semiconductor layer 2 as it is. Although unillustrated, an n⁺ type impurity region may be formed at a surface layer portion at a rear surface side of the semiconductor layer 2.

A p type impurity region 6 is formed at a surface layer portion of the semiconductor layer 2 in the active region 4. The active region 4 is defined by the p type impurity region 6. More specifically, the active region 4 is a region where a planar shape of the p type impurity region 6 is projected onto the front surface of the semiconductor layer 2.

The p type impurity region 6 is formed at a central portion of the semiconductor layer 2 in plan view. The p type impurity region 6 is formed in a quadrilateral shape in plan view that has four sides parallel to respective sides of the semiconductor layer 2. The p type impurity region 6 is formed at the inner side of the semiconductor layer 2 across intervals from peripheral edges of the semiconductor layer 2.

The p type impurity region 6 is exposed from the front surface of the semiconductor layer 2. The p type impurity region 6 forms a pn junction portion with the n⁻ type impurity region 3. A pn junction diode having the p type impurity region 6 as the anode and the n⁻ type impurity region 3 as the cathode is thereby formed.

A p type well region 7 is formed at the surface layer portion of the semiconductor layer 2 in the outer side region 5. The p type well region 7 may contain boron (B) as a p type impurity.

The p type well region 7 is formed in a band shape that extends along the peripheral edges of the p type impurity region 6 in plan view. In the present preferred embodiment, the p type well region 7 is formed in an endless shape (quadrilateral annular shape in plan view) that surrounds the p type impurity region 6. An outer periphery of the active region 4 is defined by inner peripheral edges of the p type well region 7.

The p type well region 7 is exposed from the front surface of the semiconductor layer 2. In regard to a depth direction of the semiconductor layer 2, a bottom portion of the p type well region 7 is formed at a deeper position (that is, a position closer to the rear surface of the semiconductor layer 2) than a bottom portion of the p type impurity region 6. The p type well region 7 forms a pn junction portion with the n⁻ type impurity region 3.

Referring to FIG. 2 and FIG. 3, the p type well region 7 includes an inner side peripheral edge portion 8, an outer side peripheral edge portion 9, and an inner portion 10.

The inner side peripheral edge portion 8 of the p type well region 7 is an edge portion positioned at the active region 4 side. The outer side peripheral edge portion 9 of the p type well region 7 is an edge portion positioned at an opposite side with respect to the active region 4. The inner portion 10 of the p type well region 7 is a portion between the inner side peripheral edge portion 8 and the outer side peripheral edge portion 9.

The inner portion 10 of the p type well region 7 is formed so as to be of substantially uniform thickness in lateral directions along the front surface of the semiconductor layer 2. The thickness of the inner portion 10 of the p type well region 7 is defined by a distance between the front surface of the semiconductor layer 2 and the bottom portion of the p type well region 7.

In the present preferred embodiment, a bottom portion of the inner side peripheral edge portion 8 of the p type well region 7 is formed at a position of substantially equal depth as a bottom portion of the inner portion 10 of the p type well region 7. The bottom portion of the inner side peripheral edge portion 8 of the p type well region 7 is thus connected to the bottom portion of the inner portion 10 of the p type well region 7 substantially without any step difference.

The inner side peripheral edge portion 8 of the p type well region 7 is connected to the p type impurity region 6. The inner side peripheral edge portion 8 of the p type well region 7 includes an overlap portion covering an entirety of a peripheral edge portion of the p type impurity region 6 from a region below the p type impurity region 6. The p type well region 7 is thereby formed so as to be equipotential to the p type impurity region 6.

In the present preferred embodiment, a bottom portion of the outer side peripheral edge portion 9 of the p type well region 7 is formed at a position of substantially equal depth as the bottom portion of the inner portion 10 of the p type well region 7. The bottom portion of the outer side peripheral edge portion 9 of the p type well region 7 is thus connected to the bottom portion of the inner portion 10 of the p type well region 7 substantially without any step difference.

A p type impurity concentration of the outer side peripheral edge portion 9 of the p type well region 7 is lower than a p type impurity concentration of the inner side peripheral edge portion 8 of the p type well region 7. In the present preferred embodiment, the p type impurity concentration of the inner side peripheral edge portion 8 of the p type well region 7 is substantially equal to a p type impurity concentration of the inner portion 10 of the p type well region 7. A concentration profile of the p type well region 7 shall be described specifically with reference to FIG. 4.

Figure 4:
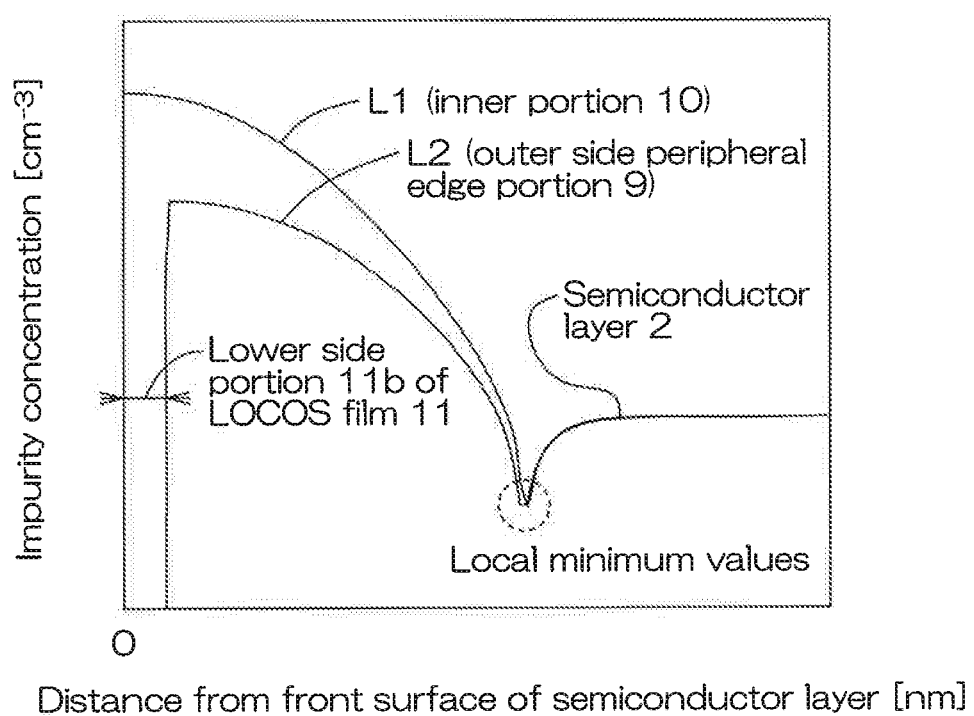
FIG. 4 is a graph of a concentration profile of p type well region.

FIG. 4 is a graph of the concentration profile of p type well region 7. In FIG. 4, the ordinate indicates the p type impurity concentration. In FIG. 4, the abscissa indicates the distance in the depth direction of the semiconductor layer 2 in case where the front surface of the semiconductor layer 2 is set to zero.

A first curve L1 and a second curve L2 are shown in FIG. 4. The first curve L1 represents a concentration profile of the inner portion 10 of the p type well region 7 along line A-A of FIG. 3. The second curve L2 represents a concentration profile of the outer side peripheral edge portion 9 of the p type well region 7 along line B-B of FIG. 3.

The first curve L1 has a local minimum value. The local minimum value of the first curve L1 is at a boundary portion (pn junction portion) between the inner portion 10 of the p type well region 7 and the semiconductor layer 2. Similarly, the second curve L2 has a local minimum value. The local minimum value of the second curve L2 is at a boundary portion (pn junction portion) between the outer side peripheral edge portion 9 of the p type well region 7 and the semiconductor layer 2.

With reference to the first curve L1, the p type impurity concentration of a front surface side of the p type well region 7 is higher than the p type impurity concentration of the bottom portion side of the p type well region 7. Similarly, with reference to the second curve L2, the p type impurity concentration of the front surface side of the p type well region 7 is higher than the p type impurity concentration of the bottom portion side of the p type well region 7.

It can be understood that the p type well region 7 has, across its entirety, p type impurity concentration that are higher than an n type impurity concentration of the semiconductor layer 2. It can also be understood that the p type well region 7 has the concentration profile where the p type impurity concentration decreases gradually in the depth direction from the front surface of the semiconductor layer 2 in its entire region.

Further, according to the first curve L1 and the second curve L2, it can be understood that the p type well region 7 has the concentration profile where the p type impurity concentration decreases gradually from the inner portion 10 (inner side peripheral edge portion 8) toward the outer side peripheral edge portion 9.

The boundary portion between the outer side peripheral edge portion 9 and the inner portion 10 shown in FIG. 2 and FIG. 3 is not manifested clearly inside the p type well region 7 but is merely indicated for convenience of description.

A case where the p type well region 7 is formed so as to have a substantially uniform p type impurity concentration shall now be considered. In this case, there is a problem that a withstand voltage of the semiconductor device can be lowered as a result of a breakdown of the semiconductor layer 2 due to an electric field concentration to the outer side peripheral edge portion 9 of the p type well region 7.

Thus, according to the semiconductor device 1 of the present preferred embodiment, the p type impurity concentration of the outer side peripheral edge portion 9 of the p type well region 7 is made lower than the p type impurity concentration of the inner side peripheral edge portion 8 of the p type well region 7. The electric field concentration with respect to the outer side peripheral edge portion 9 can thereby be suppressed. That is, the outer side peripheral edge portion 9 forms an electric field relaxation structure that relaxes the electric field concentration to the edge portion positioned at the opposite side with respect to the active region 4 in the p type well region 7.

Referring to FIG. 2 and FIG. 3, an oxide film 11 is formed on the front surface of the semiconductor layer 2. In the present preferred embodiment, the oxide film includes a LOCOS (Local Oxidation Of Silicon) film. The oxide film 11 exposes the inner side peripheral edge portion 8 and the inner portion 10 of the p type well region 7 and covers the outer side peripheral edge portion 9 of the p type well region 7.

In the p type well region 7, the p type impurity concentration of the outer side peripheral edge portion 9 that is covered by the oxide film 11 is made lower than the p type impurity concentration of the inner side peripheral edge portion 8 and the inner portion 10 that are exposed from the oxide film 11.

Such a structure is formed because, in the p type well region 7, the p type impurity contained in the outer side peripheral edge portion 9 is absorbed by the oxide film 11 during manufacture. A portion covering the outer side peripheral edge portion 9 in the oxide film 11 thus contains the p type impurity. The p type impurity contained in the oxide film 11 is constituted of the same type of p type impurity (that is, boron) as the p type impurity contained in the p type well region 7.

A portion of the oxide film 11 is embedded inside the semiconductor layer 11. The oxide film 11 includes an upper side portion 11a positioned above the front surface of the semiconductor layer 2 and a lower side portion 11b positioned inside the semiconductor layer 2.

An end portion 11c positioned at the active region 4 side in the oxide film 11 is located on the p type well region 7.

The end portion 11c of the oxide film 11 may have a bird's beak portion. The bird's beak portion has a tapered shape where a thickness of the active region 4 side is smaller than a thickness of the outer side region 5 side.

A distance D between the end portion 11c of the oxide film 11 and an outer peripheral edge of the p type well region 7 is, for example, equal to or greater than 10 μm and equal to or less than 100 μm (approximately 20 μm in the present preferred embodiment). A thickness of the oxide film 11 is, for example, equal to or greater than 15000 Å and equal to or less than 25000 Å. A thickness of the lower side portion 11b of the oxide film 11 is, for example, equal to or greater than 40% and equal to or less than 50% of the thickness of the oxide film 11 (=equal to or greater than 6000 Å and equal to or less than 12500 Å).

A front surface insulating film 12 is further formed on the front surface of the semiconductor layer 2. The front surface insulating film 12 covers a front surface of the p type impurity region 6 and the front surface of the p type well region 7 that are exposed from the oxide film 11. The front surface insulating film 12 has a thickness smaller than the thickness of the oxide film 11. The front surface insulating film 12 is formed integral to the oxide film 11.

The thickness of the front surface insulating film 12 is, for example, equal to or greater than 100 Å and equal to or less than 1000 Å. The front surface insulating film 12 may include an oxide film ($SiO_2$ film). The front surface insulating film 12 may include a nitride film (SiN film).

Referring again to FIG. 1, a p type FLR (Field Limiting Ring) region 13 is formed at the surface layer portion of the semiconductor layer 2 in the outer side region 5. The p type FLR region 13 is formed in a region opposite to the p type impurity region 6 with respect to the p type well region 7. The p type FLR region 13 is formed across an interval from the p type well region 7.

The p type FLR region 13 is formed in a band shape in plan view that extends along peripheral edges of the p type well region 7. In the present preferred embodiment, the p type FLR region 13 is formed in an endless shape (quadrilateral annular shape in plan view) that surrounds the p type well region 7. The p type FLR region 13 may include a plurality of p type FLR regions 13 that surround the p type well region 7.

Although not illustrated, a front surface electrode, extending continuously from above the front surface insulating film 12 to above the oxide film 11, may be formed above the front surface of the semiconductor layer 2. The front surface electrode may face the outer side peripheral edge portion 9 of the p type well region 7 across the oxide film 11.

Figure 5:
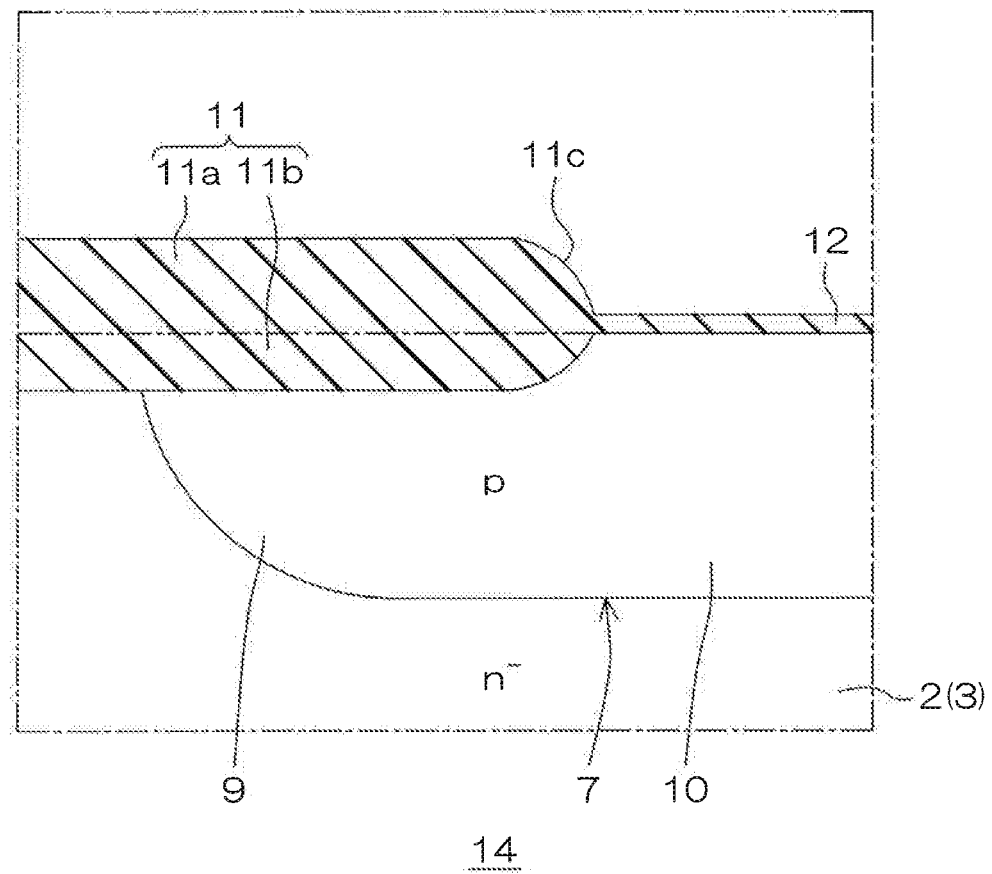
FIG. 5 is an enlarged view of a portion of a p type well region of a semiconductor device according to a reference example.

FIG. 5 is an enlarged view of a portion of the p type well region 7 of a semiconductor device 14 according to a reference example. FIG. 5 is also an enlarged view of a portion corresponding to FIG. 3 described above. In FIG. 5, arrangements that are the same as the arrangements described above in FIG. 1 to FIG. 3 are provided with the same reference symbols and description thereof shall be omitted.

Referring to FIG. 5, according to the semiconductor device 14 of the reference example, the entirety of the p type well region 7 is formed so as to have a uniform p type impurity concentration. The outer side peripheral edge portion 9 of the p type well region 7 is thus formed so as to have a p type impurity concentration equal to the p type impurity concentration of the inner portion 10 of the p type well region 7.

Figure 6:
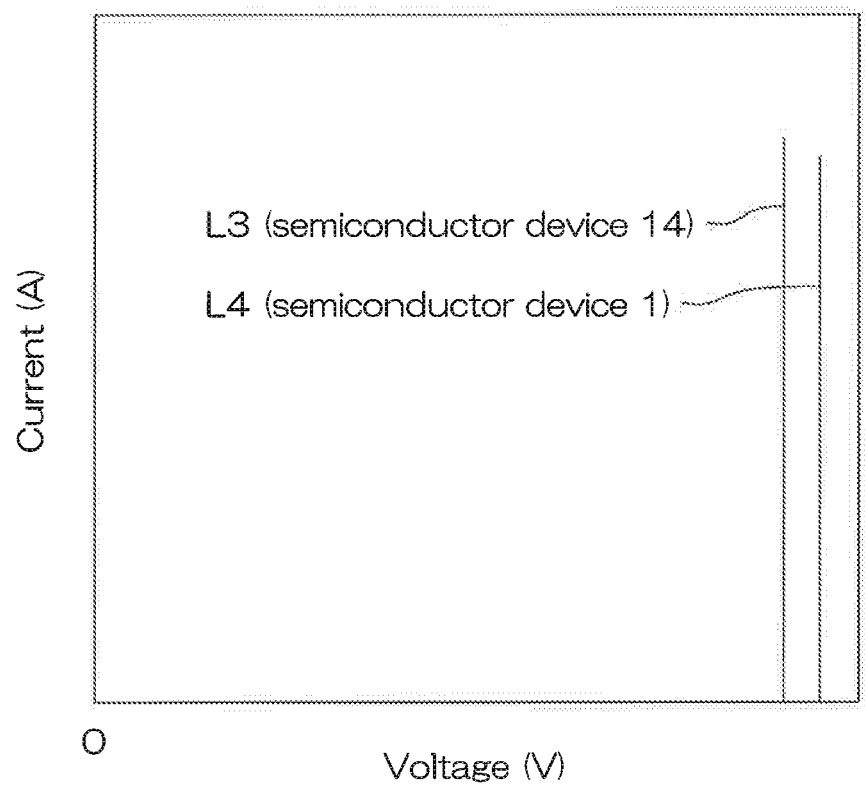
FIG. 6 is a graph of a withstand voltage of the semiconductor device of FIG. 1 and a withstand voltage of the semiconductor device of FIG. 5.

FIG. 6 is a graph of the withstand voltage of the semiconductor device 1 of FIG. 1 and the withstand voltage of the semiconductor device 14 of FIG. 5. In FIG. 6, the ordinate indicates the current value when the semiconductor device breaks down. The abscissa indicates the voltage value when the semiconductor device breaks down.

A first bar L3 and a second bar L4 are shown in the graph of FIG. 6. The first bar L3 represents the withstand voltage of the semiconductor device 14 of the reference example. The second bar L4 represents the withstand voltage of the semiconductor device 1 of the present preferred embodiment.

With reference to the first bar L3 and the second bar L4, the voltage value when the semiconductor device 1 of the present preferred embodiment breaks down is higher than the voltage value when the semiconductor device 14 of the reference example breaks down. Further, the current value when the semiconductor device 1 of the present preferred embodiment breaks down is less than the current value when the semiconductor device 14 of the reference example breaks down.

It could be confirmed that making the p type impurity concentration of the outer side peripheral edge portion 9 of the p type well region 7 lower than the p type impurity concentration of the inner portion 10 of the p type well region 7 is effective in terms of improving the withstand voltage of the semiconductor device 1.

As described above, according to the semiconductor device 1 of the present preferred embodiment, the p type impurity concentration of the outer side peripheral edge portion 9 of the p type well region 7 is lower than the p type impurity concentration of the inner side peripheral edge portion 8 (inner portion 10) of the p type well region 7. The electric field concentration to the outer side peripheral edge portion 9 of the p type well region 7 can thus be suppressed.

Also, according to the semiconductor device 1 of the present preferred embodiment, in the p type well region 7, the outer side peripheral edge portion 9 has the concentration profile where the p type impurity concentration decreases gradually in the depth direction from the front surface of the semiconductor layer 2. A sudden change in the p type impurity concentration of the outer side peripheral edge portion 9 can thereby be suppressed in regard to the depth direction of the semiconductor layer 2. Occurrence of an undesirable electric field concentration to the outer side peripheral edge portion 9 can thus be suppressed.

Also, according to the semiconductor device 1 of the present preferred embodiment, the p type well region 7 has the concentration profile where the p type impurity concentration decreases gradually from the inner side peripheral edge portion 8 (inner portion 10) toward the outer side peripheral edge portion 9. A sudden change in the p type impurity concentration of the outer side peripheral edge portion 9 can thereby be suppressed in regard to the lateral directions along the front surface of the semiconductor layer 2. Occurrence of an undesirable electric field concentration to a region between the inner side peripheral edge portion 8 and the outer side peripheral edge portion 9 can thus be suppressed.

Further, according to the semiconductor device 1 of the present preferred embodiment, the bottom portion of the outer side peripheral edge portion 9 of the p type well region 7 is formed at the position of substantially equal depth as the bottom portion of the inner portion 10 of the p type well region 7. Also, the bottom portion of the outer side peripheral edge portion 9 of the p type well region 7 is connected substantially without any step difference to the bottom portion of the inner portion 10 of the p type well region 7. Occurrence of an undesirable electric field concentration to a region between the bottom portion of the inner portion 10 and the bottom portion of the outer side peripheral edge portion 9 can thus be suppressed.

The semiconductor device 1, having a structure where the electric field concentration to the outer side peripheral edge portion 9 of the p type well region 7 can be suppressed and the withstand voltage can be improved, can thus be provided.

FIG. 7 is a flowchart of an example of a method for manufacturing the semiconductor device 1 of FIG. 1. FIG. 8A to FIG. 8F are sectional views of a process for manufacturing the semiconductor device 1 of FIG. 1.

Figure 8A:
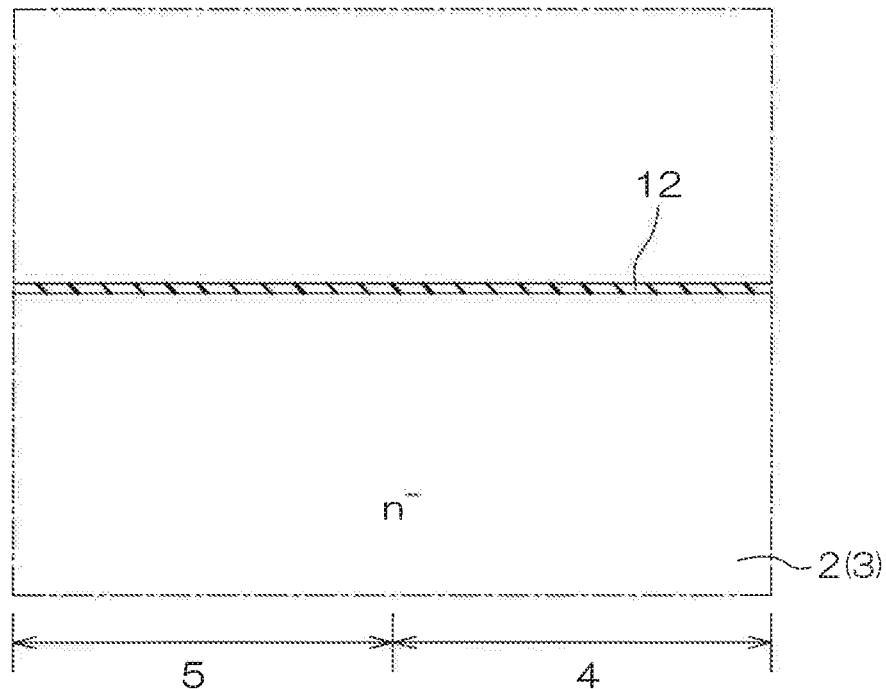
FIG. 8A to FIG. 8F are sectional views of a process for manufacturing the semiconductor device of FIG. 1.

With reference to FIG. 8A, first, the semiconductor layer 2 is prepared (step S1). The semiconductor layer 2 includes the $n^-$ type impurity region 3 formed in an entire region of the semiconductor layer 2. The semiconductor layer 2 is formed, for example, using a semiconductor wafer made of an $n^-$ type Si monocrystal. The semiconductor wafer may be manufactured by the FZ method. The active region 4, in which the functional element is formed, and the outer side region 5, outside the active region 4, are set in the semiconductor layer 2.

Next, the front surface insulating film 12 is formed on the front surface of the semiconductor layer 2 (step S2). The front surface insulating film 12 is formed, for example, by depositing an insulating material on the front surface of the semiconductor layer 2 by a CVD (Chemical Vapor Deposition) method. The front surface insulating film 12 may also be formed by a thermal oxidation treatment in place of the CVD method. In this case, the front surface insulating film 12 that is constituted of an oxide film is formed on the front surface of the semiconductor layer 2.

Figure 8B:
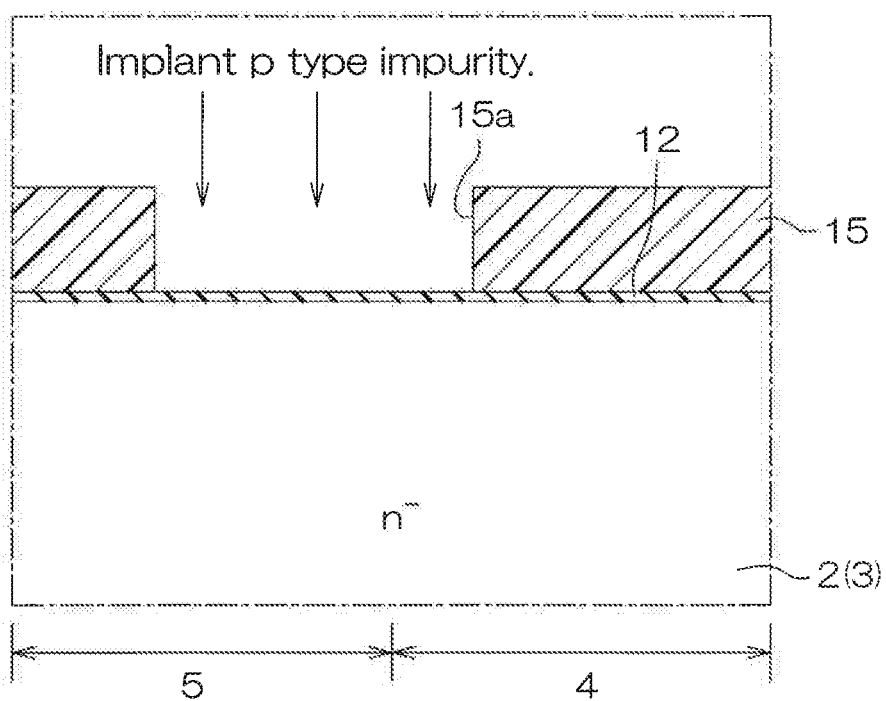

Next, with reference to FIG. 8B, an ion implantation mask 15, having a predetermined pattern, is formed on the front surface insulating film 12 (step S3). The ion implantation mask 15 has openings 15a that selectively expose a region in which the p type well region 7 is to be formed and a region in which the p type FLR region 13 is to be formed.

Next, a p type impurity (boron, in the present preferred embodiment) is implanted into surface layer portions of the semiconductor layer 2 by ion implantation via the ion implantation mask 15. In the region in which the p type well region 7 is to be formed, the p type impurity is implanted into the surface layer portion of the semiconductor layer 2 along the peripheral edges of the active region 4. After implantation of the p type impurity, the ion implantation mask 15 is removed.

Figure 8C:
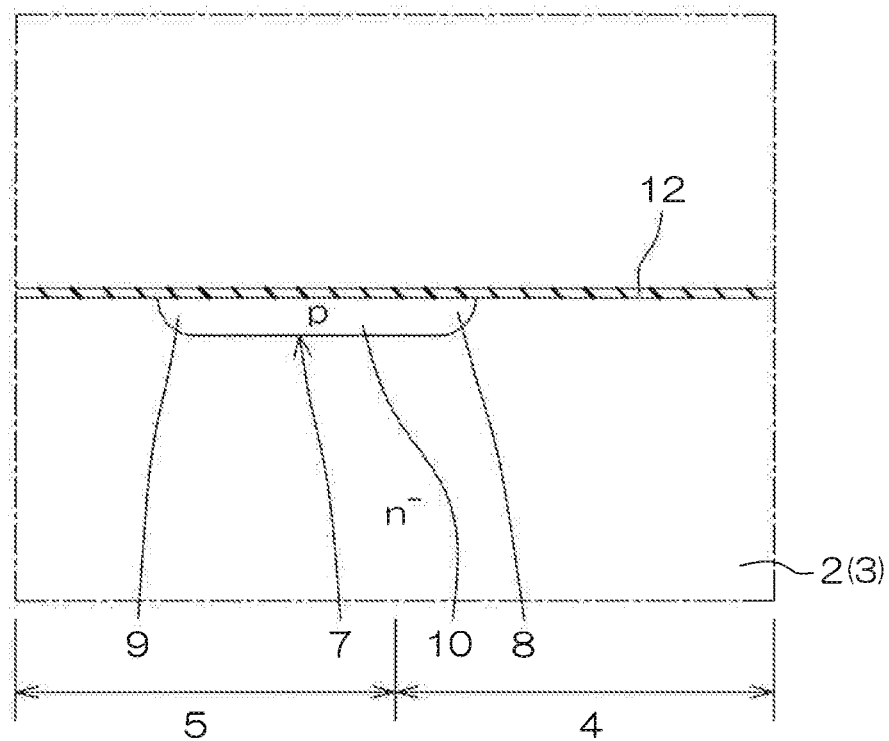

Next, with reference to FIG. 8C, the p type impurity is activated by an annealing treatment. The p type well region 7 is thereby formed. The p type well region 7 includes the inner side peripheral edge portion 8, positioned at the active region 4 side, the outer side peripheral edge portion 9, positioned at the opposite side with respect to the active region 4 side, and the inner portion 10 between the inner side peripheral edge portion 8 and the outer side peripheral edge portion 9.

In this process, the p type impurity diffuses in the depth direction from the front surface of the semiconductor layer 2. The p type well region 7, having the concentration profile where the p type impurity concentration decreases gradually in the depth direction from the front surface of the semiconductor layer 2, is thereby formed. Also, the p type FLR region 13 is formed in the outer side region 5 of the semiconductor layer 2 at the same time as the formation of the p type well region 7.

The p type well region 7 and the p type FLR region 13 may be formed by a thermal diffusion treatment method instead of the ion implantation method in this process.

For example, first, a mask (not shown) having a predetermined pattern is formed on the front surface insulating film 12. The mask (not shown) has openings that selectively expose a region in which the p type well region 7 is to be formed and a region in which the p type FLR region 13 is to be formed.

Next, a compound that contains a p type impurity (boron, in the present preferred embodiment) is deposited on the front surface insulating film 12. Next, heat is applied to the compound by heat treatment. The p type impurity contained in the compound is thereby made to diffuse inside the semiconductor layer 2.

In this process, the p type impurity diffuses in the depth direction from the front surface of the semiconductor layer 2. The p type well region 7, having the concentration profile where the p type impurity concentration decreases gradually in the depth direction from the front surface of the semiconductor layer 2, is thereby formed. Also, the p type FLR region 13 is formed in the outer side region 5 of the semiconductor layer 2 at the same time as the formation of the p type well region 7. Thereafter, the mask (not shown) is removed.

The compound containing the p type impurity may be deposited directly on the front surface of the semiconductor layer 2 instead of on the front surface insulating film 12. The p type FLR region 13 may be formed in a different process from that for the p type well region 7.

Figure 8D:
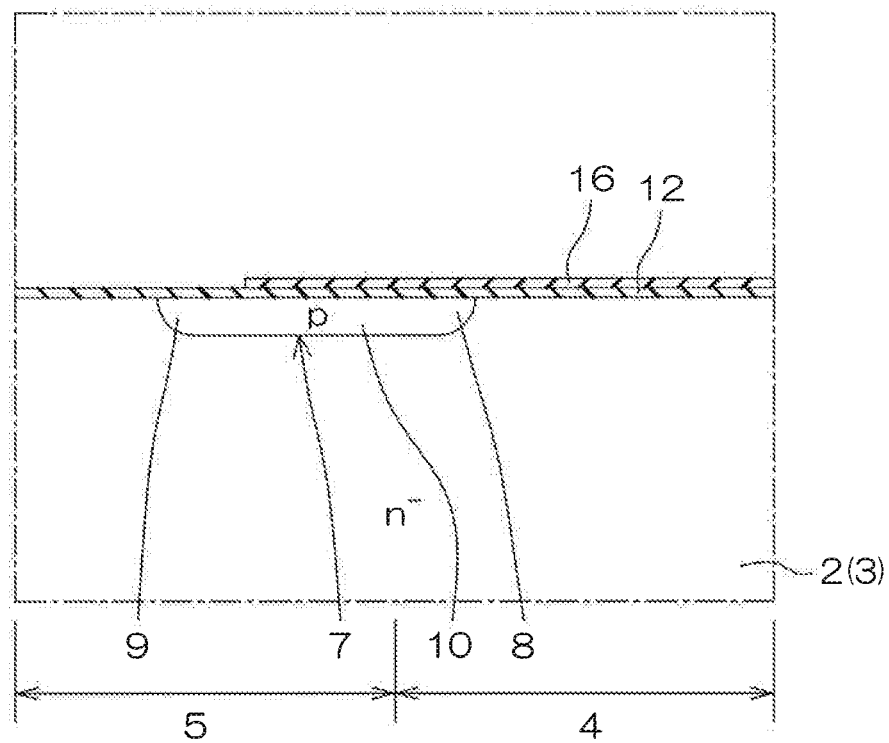

Next, with reference to FIG. 8D, a protective film 16 having a predetermined pattern is formed selectively on the front surface insulating film 12 (step S4). In the present preferred embodiment, the protective film 16 is a nitride film. The protective film 16 has a pattern that exposes the region in which the oxide film 11 is to be formed.

More specifically, the protective film 16 has a pattern that covers at least the inner side peripheral edge portion 8 and the inner portion 10 of the p type well region 7 and exposes the outer side peripheral edge portion 9 of the p type well region 7.

Figure 8E:
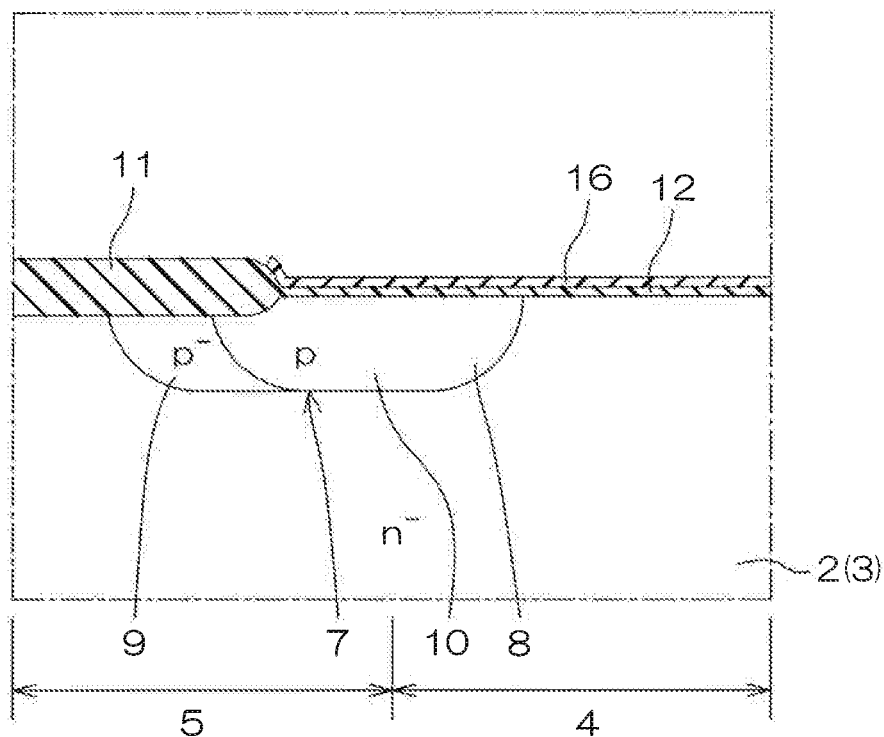

Next, with reference to FIG. 8E, the front surface of the semiconductor layer 2 that is exposed from the protective film 16 is oxidized (step S5). The oxidation of the front surface of the semiconductor layer 2 is performed by a thermal oxidation treatment. The oxide film 11, which exposes the inner side peripheral edge portion 8 and the inner portion 10 of the p type well region 7 and covers the outer side peripheral edge portion 9 of the p type well region 7, is thereby formed.

In this process, the front surface insulating film 12 that is exposed from the protective film 16 becomes a portion of the oxide film 11. Also in this process, the p type impurity contained in the p type well region 7 diffuses further in the depth direction of the semiconductor layer 2 and the directions along the front surface of the semiconductor layer 2.

Further in this process, a portion of the p type impurity forming the outer side peripheral edge portion 9 of the p type well region 7 is absorbed by the oxide film 11. That is, in the thermal oxidation treatment, the oxide film 11 grows while absorbing the p type impurity from the outer side peripheral edge portion 9 of the p type well region 7. The p type well region 7, having the structure where the p type impurity concentration of the outer side peripheral edge portion 9 is lower than the p type impurity concentration of the inner side peripheral edge portion 8, is thereby formed. After the oxide film 11 is formed, the protective film 16 is removed.

Figure 8F:
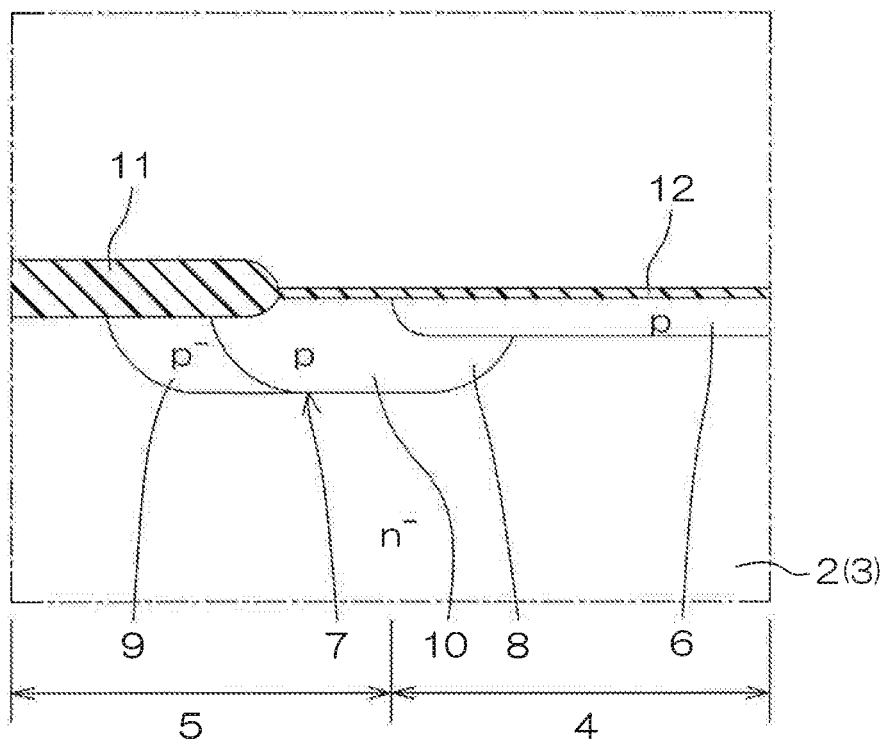

Next, with reference to FIG. 8F, an ion implantation mask (not shown), having a predetermined pattern, is formed on the front surface insulating film 12 (step S6). The ion implantation mask (not shown) has an opening that selectively exposes the active region 4.

Next, the p type impurity is implanted into the surface layer portion of the semiconductor layer 2 via the ion implantation mask (not shown). The p type impurity region 6 that defines the active region 4 is thereby formed. Thereafter, the ion implantation mask is removed. The semiconductor device 1 is manufactured through the above processes.

According to the method for manufacturing the semiconductor device 1 of the present preferred embodiment, in the thermal oxidation treatment process (step S5), the oxide film 11 absorbs the p type impurity (boron, in the present preferred embodiment) from the outer side peripheral edge portion 9 of the p type well region 7 at the same time as the formation of the oxide film 11. The p type well region 7, having the structure where the p type impurity concentration of the outer side peripheral edge portion 9 is lower than the p type impurity concentration of the inner side peripheral edge portion 8, can thereby be formed.

Also in the process of forming the p type well region (step S3), the p type impurity concentration is made to diffuse in the depth direction of the semiconductor layer 2 by the ion implantation method or the thermal diffusion method. Further, in the subsequent thermal oxidation treatment process (step S5), the p type impurity in the outer side peripheral edge portion 9 of the p type well region 7 is absorbed by the oxide film 11.

The p type well region 7 having the structure where the concentration profile of the p type impurity concentration decreases gradually in the depth direction of the semiconductor layer 2, and where the p type impurity concentration of the outer side peripheral edge portion 9 of the p type well region 7 is comparatively low, can thus be formed. Occurrence of an undesirable electric field concentration to the outer side peripheral edge portion 9 can thus be suppressed.

Also in the above processes, the p type impurity of the outer side peripheral edge portion 9 of the p type well region 7 is absorbed by the oxide film 11. The p type well region 7, having the concentration profile where the p type impurity concentration decreases gradually from the inner side peripheral edge portion 8 (inner portion 10) toward the outer side peripheral edge portion 9, is thereby formed. Occurrence of an undesirable electric field concentration to a region between the inner side peripheral edge portion 8 and the outer side peripheral edge portion 9 can thus be suppressed.

Further, in the process of forming the p type well region 7 (step S3), the bottom portion of the outer side peripheral edge portion 9 of the p type well region 7 is formed at the position of substantially equal depth as the bottom portion of the inner portion 10 of the p type well region 7. Also, the bottom portion of the outer side peripheral edge portion 9 of the p type well region 7 is connected substantially without any step difference to the bottom portion of the inner portion 10 of the p type well region 7. Occurrence of an undesirable electric field concentration to a region between the bottom portion of the inner portion 10 and the bottom portion of the outer side peripheral edge portion 9 can thus be suppressed.

The semiconductor device 1, having the structure where the concentration of electric field to the outer side peripheral edge portion 9 of the p type well region 7 can be suppressed and the withstand voltage can be improved, can thus be provided.

Figure 9:
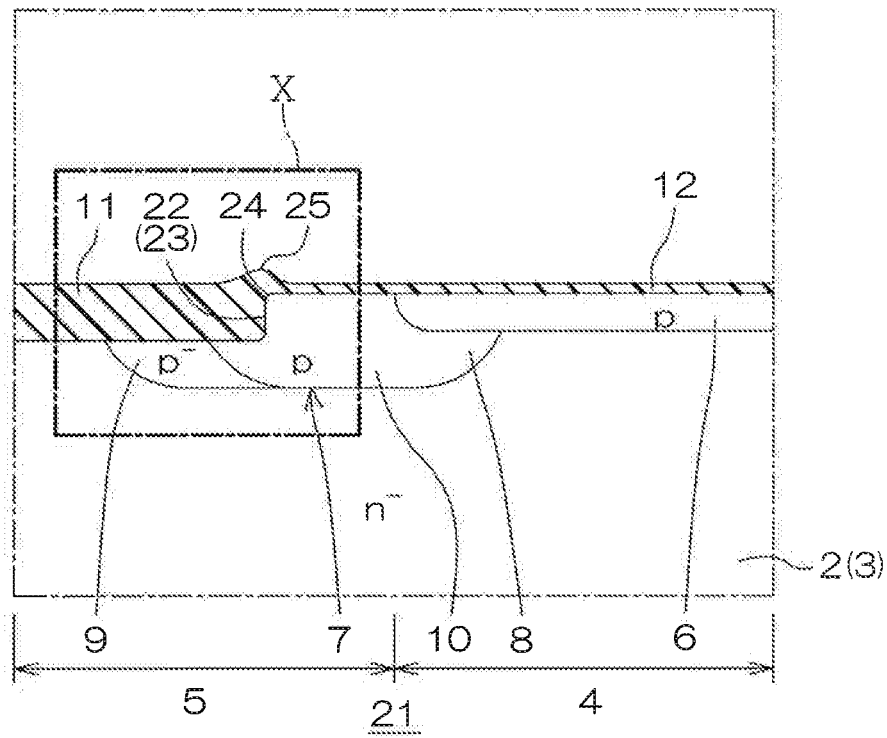
FIG. 9 is a sectional view of a p type well region and a region in a periphery thereof of a semiconductor device according to a second preferred embodiment of the present invention.
Figure 10:
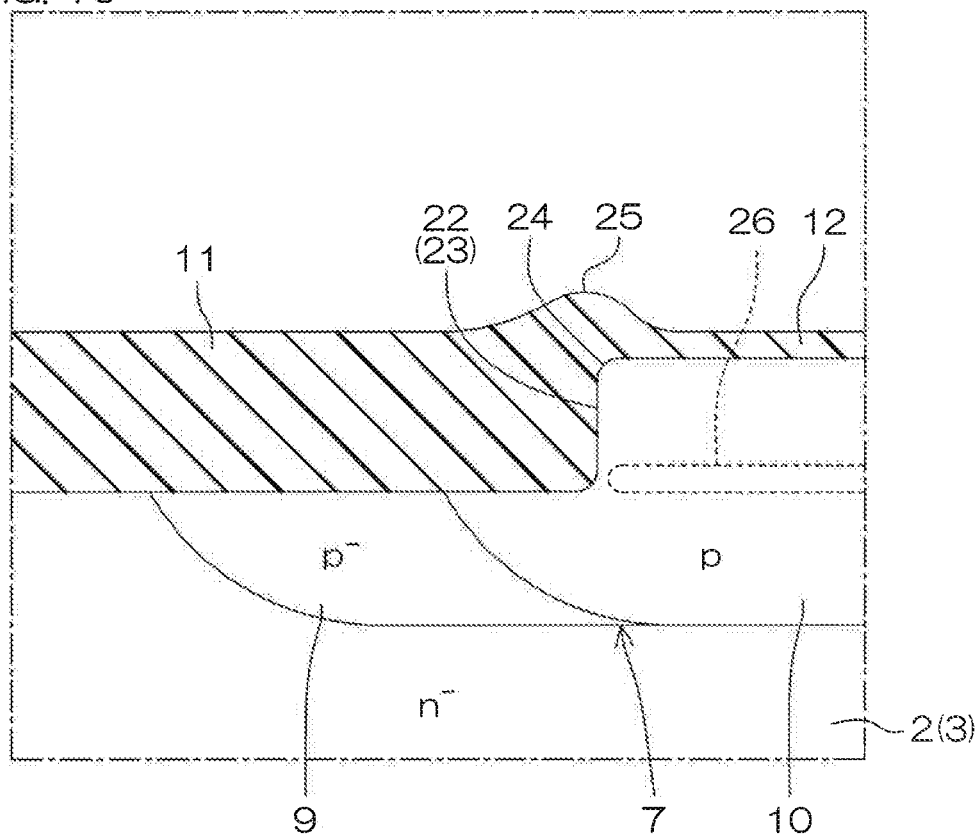
FIG. 10 is an enlarged view of a region X of FIG. 9.

FIG. 9 is a sectional view of the p type well region 7 and a region in a periphery thereof of a semiconductor device 21 according to a second preferred embodiment of the present invention. FIG. 9 is also a sectional view of a portion corresponding to FIG. 2 described above. FIG. 10 is an enlarged view of a region X of FIG. 9. In FIG. 9 and FIG. 10, arrangements that are the same as the arrangements described in the first preferred embodiment are provided with the same reference symbols and description thereof shall be omitted.

With reference to FIG. 9, in the present preferred embodiment, a step portion 22, which is depressed in step-like manner in the depth direction from the front surface of the semiconductor layer 2, is formed in a region that includes the outer side peripheral edge portion 9 of the p type well region 7 in the front surface of the semiconductor layer 2. The step portion 22 may be formed by a groove 23 dug in the front surface of the semiconductor layer 2 in the depth direction.

In the present preferred embodiment, the outer side peripheral edge portion 9 of the p type well region 7 is exposed from a bottom wall of the step portion 22. The step portion 22 has a step surface connecting a front surface of the outer side peripheral edge portion 9 and a front surface of the inner portion 10. The inner portion 10 of the p type well region 7 is exposed from the step surface of the step portion 22.

The bottom portion of the outer side peripheral edge portion 9 of the p type well region 7 is formed at a position of substantially equal depth as the bottom portion of the inner portion 10 of the p type well region 7 in the present preferred embodiment as well. The bottom portion of the outer side peripheral edge portion 9 of the p type well region 7 is therefore connected substantially without any step difference to the bottom portion of the inner portion 10 of the p type well region 7.

The p type well region 7 has the concentration profile where the p type impurity concentration decreases gradually in the depth direction from the front surface of the semiconductor layer 2. The p type impurity concentration of a front surface side of the outer side peripheral edge portion 9 that is exposed from the step portion 22 is lower than the p type impurity concentration of a front surface side of the inner portion 10 that is exposed from the front surface of the semiconductor layer 2.

Even in a state where the oxide film 11 is not present on the front surface of the semiconductor layer 2, the outer side peripheral edge portion 9 of the p type well region 7 has a lower p type impurity concentration than the p type impurity concentration of the inner portion 10 of the p type well region 7. Therefore, according to the semiconductor device 21 of the present preferred embodiment, the same effect as the electric field relaxation effect described in the first preferred embodiment can be achieved by the outer side peripheral edge portion 9 of the p type well region 7 even in the state where the oxide film 11 is not present.

In the present preferred embodiment, the oxide film 11 is further formed on the front surface of the semiconductor layer 2. The electric field relaxation effect is thus achieved reliably. The oxide film 11 covers the front surface of the outer side peripheral edge portion 9 of the p type well region 7 and the step surface of the step portion 22. In the present preferred embodiment, the oxide film 11 fills the step portion 22 and is formed integral to the front surface insulating film 12 that covers the front surface of the semiconductor layer 2. A front surface of the oxide film 11 is positioned above the front surface of the semiconductor layer 2.

The oxide film 11 has a projecting portion 25 in a region along a corner portion 24 connecting the front surface of the semiconductor layer 2 and the step surface of the step portion 22. The projecting portion 25 of the oxide film 11 projects above a front surface of the front surface insulating film 12. On the basis of the front surface of the semiconductor layer 2, a thickness of the projecting portion 25 is greater than the thickness of the front surface insulating film 12.

In the present preferred embodiment, an example where the oxide film 11 has a thickness greater than a thickness of the step portion 22 was described. However, the oxide film 11 may have a thickness less than the thickness of the step portion 22. In this case, the oxide film 11 may be formed such that one surface at the semiconductor layer 2 side and the other surface at the opposite side conform to the front surface of the outer side peripheral edge portion 9 of the p type well region 7 and the step surface of the step portion 22.

As described in the first preferred embodiment, the oxide film 11 absorbs a portion of the p type impurity of the outer side peripheral edge portion 9. The p type impurity concentration of the outer side peripheral edge portion 9 is thus reduced further by the oxide film 11.

The inner portion 10 of the p type well region 7 includes an intermediate portion 26 positioned on the same plane as the front surface of the outer side peripheral edge portion 9 in an intermediate portion in a depth direction of the p type well region 7. In FIG. 10, the intermediate portion 26 is indicated by dotted lines. The p type impurity concentration of the front surface side of the outer side peripheral edge portion 9 is lower than a p type impurity concentration of the intermediate portion 26 of the inner portion 10.

As described above, according to the semiconductor device 21 of the present preferred embodiment, the step portion 22 which is depressed in the depth direction from the front surface of the semiconductor layer 2, is formed in the region that includes the outer side peripheral edge portion 9 of the p type well region 7 in the front surface of the semiconductor layer 2. In the well region 7, the p type impurity concentration of the front surface side of the outer side peripheral edge portion 9 that is exposed from the step portion 22 is lower than the p type impurity concentration of a front surface side of the inner side peripheral edge portion 8 (inner region 10) that is exposed from the front surface of the semiconductor layer 2.

The p type impurity introduced in the surface layer portion of the semiconductor layer 2 diffuses in the depth direction from the front surface of the semiconductor layer 2. The p type impurity concentration of the front surface side of the p type well region 7 thus becomes higher than the p type impurity concentration of the bottom portion side of the p type well region 7.

Therefore, the outer side peripheral edge portion 9, having a lower p type impurity concentration than the p type impurity concentration of the inner side peripheral edge portion 8 (inner portion 10), can be formed by removing a region at the front surface side where the p type impurity concentration is comparatively high, so that a region at the bottom portion side where the p type impurity concentration is comparatively low remains in the outer side peripheral edge portion 9. The same effects as the effects described in the first preferred embodiment can thereby be achieved.

Also, according to the semiconductor device 21 of the present preferred embodiment, the oxide film 11 that covers the outer side peripheral edge portion 9 is formed. The p type impurity of the outer side peripheral edge portion 9 is absorbed by the oxide film 11. The p type impurity concentration of the outer side peripheral edge portion 9 can thereby be reduced further. The electric field relaxation effect by the outer side peripheral edge portion 9 can thus be enhanced.

Also, according to the semiconductor device 21 of the present preferred embodiment, the step surface of the step portion 22 is covered by the oxide film 11. The p type impurity of the inner portion 10 of the p type well region 7 is thus absorbed by the oxide film 11 through the step surface of the step portion 22. The p type well region 7, having the concentration profile where the p type impurity concentration decreases gradually from the inner portion 10 toward the outer side peripheral edge portion 9, can thus be formed.

According to the p type well region 7 having such a structure, a sudden change in the p type impurity concentration from the inner portion 10 toward the outer side peripheral edge portion 9 can be suppressed. Occurrence of an undesirable electric field concentration to a region between the inner portion 10 and the outer side peripheral edge portion 9 can thus be suppressed.

FIG. 11 is a flowchart of an example of a method for manufacturing the semiconductor device 21 of FIG. 9.

With reference to FIG. 11, the method for manufacturing the semiconductor device 21 of the present preferred embodiment differs from the method for manufacturing the semiconductor device 1 (see also FIG. 7) in the point of including a process of selectively removing a portion of the outer side peripheral edge portion 9 of the p type well region 7 (step S11). The step S11 is performed after the process of forming the protective film 16 (step S4) and prior to the thermal oxidation treatment process (step S5).

FIG. 12A to FIG. 12E are sectional views of a process for manufacturing the semiconductor device 21 of FIG. 9. In FIG. 12A to FIG. 12E, description of processes that are the same as the processes described above for the method for manufacturing the semiconductor device 1 (see FIG. 7 and FIG. 8A to FIG. 8F) shall be omitted.

Figure 12A:
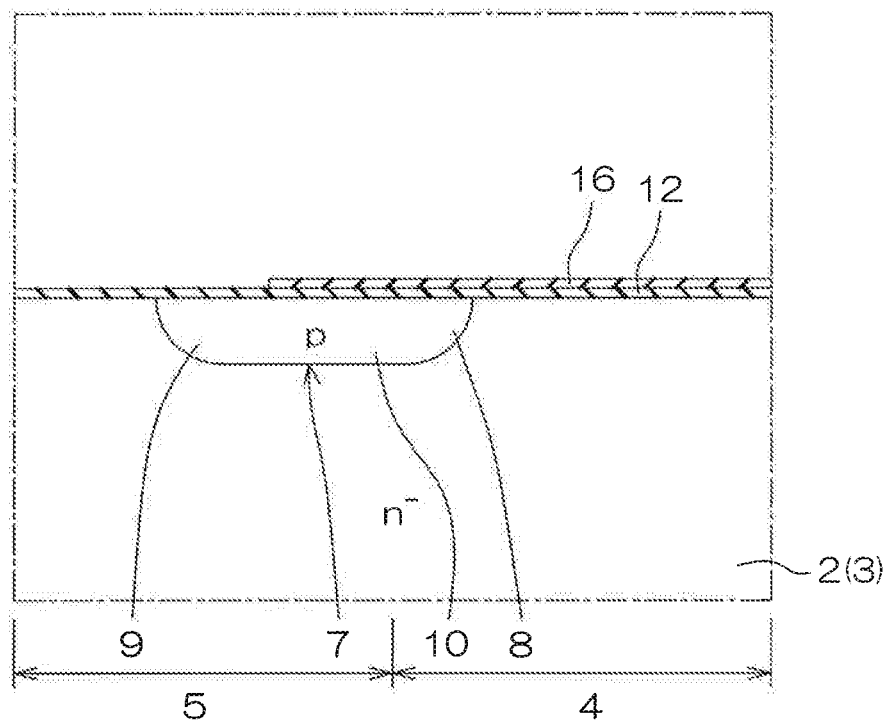
FIG. 12A to FIG. 12E are sectional views of a process for manufacturing the semiconductor device of FIG. 9.

With reference to FIG. 12A, the semiconductor layer 2, having the protective film 16 formed on the front surface insulating film 12, is prepared through step S1 to step S4.

Figure 12B:
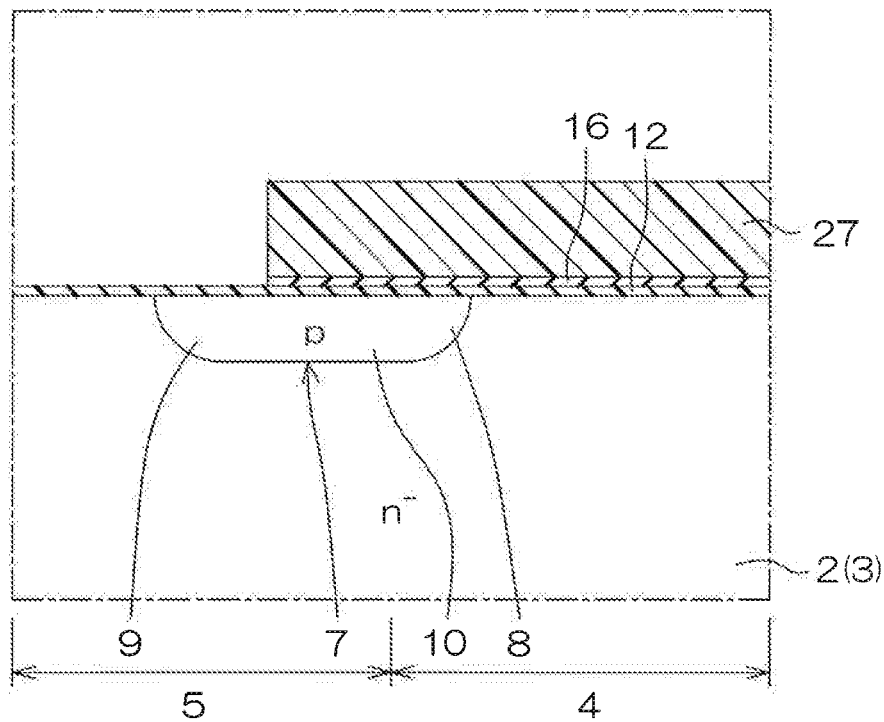

Next, with reference to FIG. 12B, a mask 27 having a predetermined pattern is formed on the protective film 16. The mask 27 has an opening selectively exposing a region in which the step portion 22 is to be formed. More specifically the mask 27 covers the outer side peripheral edge portion 9 and the inner portion 10 of the p type well region 7 and selectively exposes a region at which a portion of the outer side peripheral edge portion 9 of the p type well region 7 is to be removed.

Figure 12C:
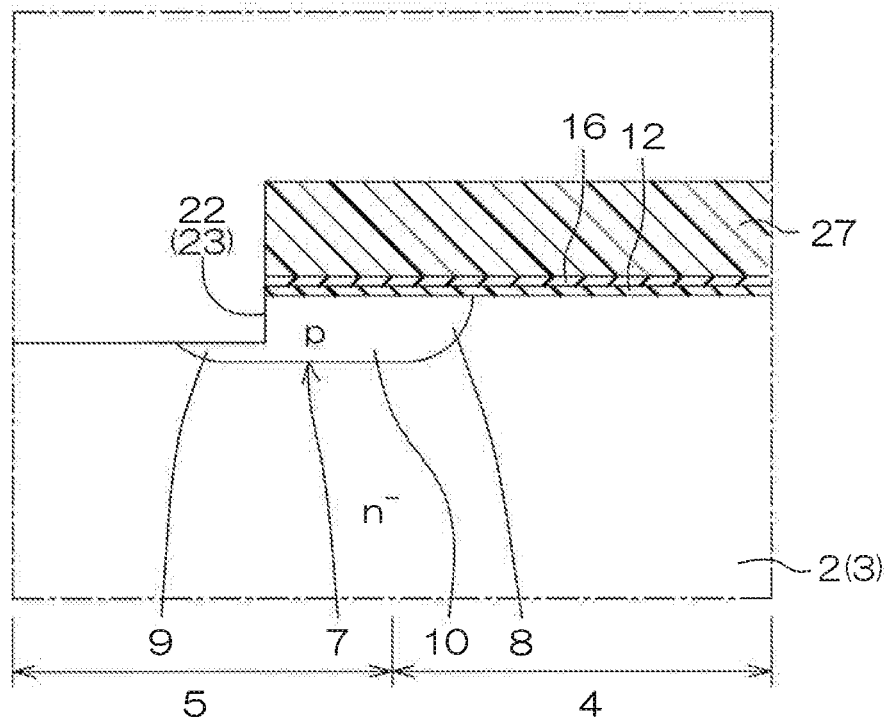

Next, with reference to FIG. 12C, an unnecessary region of the semiconductor layer 2 is selectively removed by for etching via the mask 27, example. More specifically, in this process, the outer side peripheral edge portion 9 of the p type well region 7 is selectively removed so that the bottom portion of the outer side peripheral edge portion 9 of the p type well region 7 remains. The step portion 22 is thereby formed. After the step portion 22 is formed, the mask 27 is removed. The process of forming the step portion 22 may be a process of forming the groove 23 in the front surface of the semiconductor layer 2.

In the process of step S3 described above, the p type well region 7, having the concentration profile where the p type impurity concentration decreases gradually in the depth direction from the front surface of the semiconductor layer 2, is formed. Therefore, in the state where the step portion 22 is formed, the p type impurity concentration of the front surface side of the outer side peripheral edge portion 9 is lower than the p type impurity concentration of the front surface side of the inner portion 10.

Figure 12D:
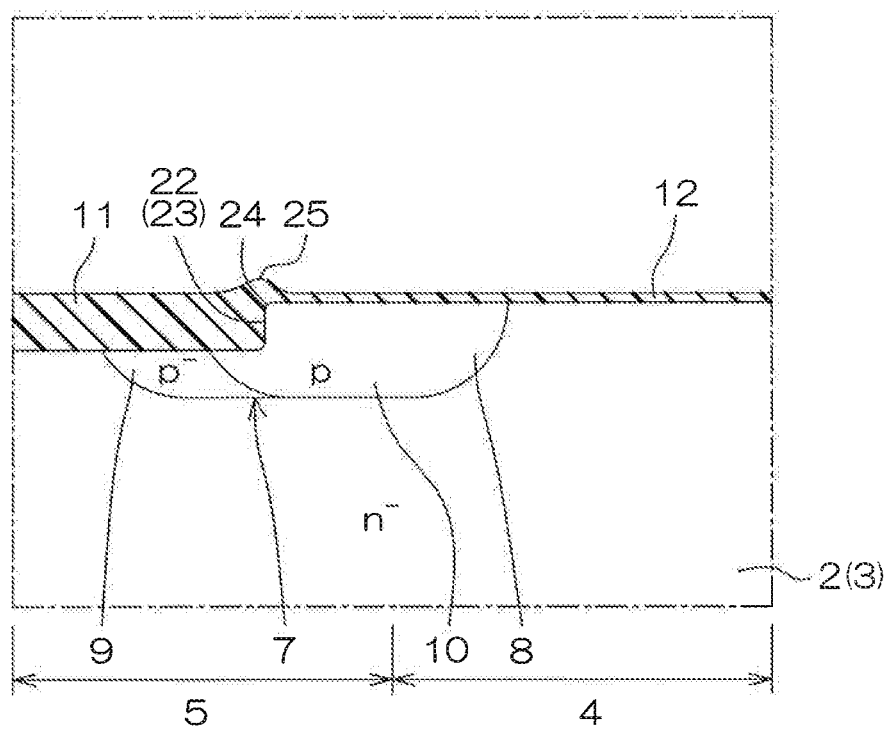

Next, with reference to FIG. 12D, the front surface of the semiconductor layer 2 that is exposed from the protective film 16 is oxidized (step S5). The oxidation of the front surface of the semiconductor layer 2 is performed by the thermal oxidation treatment. The oxide film 11, which fills the step portion 22 and is integral to the front surface insulating film 12, is thereby formed.

In this process, the thick oxide film 11 is formed along the corner portion 24 connecting the front surface of the semiconductor layer 2 and the step surface of the step portion 22. The oxide film 11, having the projecting portion in the region along the corner portion 24 of the semiconductor layer 2, is thereby formed.

Also in this process, the p type well region 7 diffuses further in the depth direction of the semiconductor layer 2 and the in lateral directions parallel to the front surface of the semiconductor layer 2.

Also in this process, a portion of the p type impurity forming the outer side peripheral edge portion 9 is absorbed by the oxide film 11. Further in this process, a portion of the p type impurity which forms the inner portion 10 is absorbed by the oxide film 11 through the step surface of the step portion 22. The p type impurity concentration of the outer side peripheral edge portion 9 exposed from the step portion 22 and the p type impurity concentration of the inner portion 10 exposed from the step surface of the step portion 22 are thereby lowered by the oxide film 11.

Figure 12E:
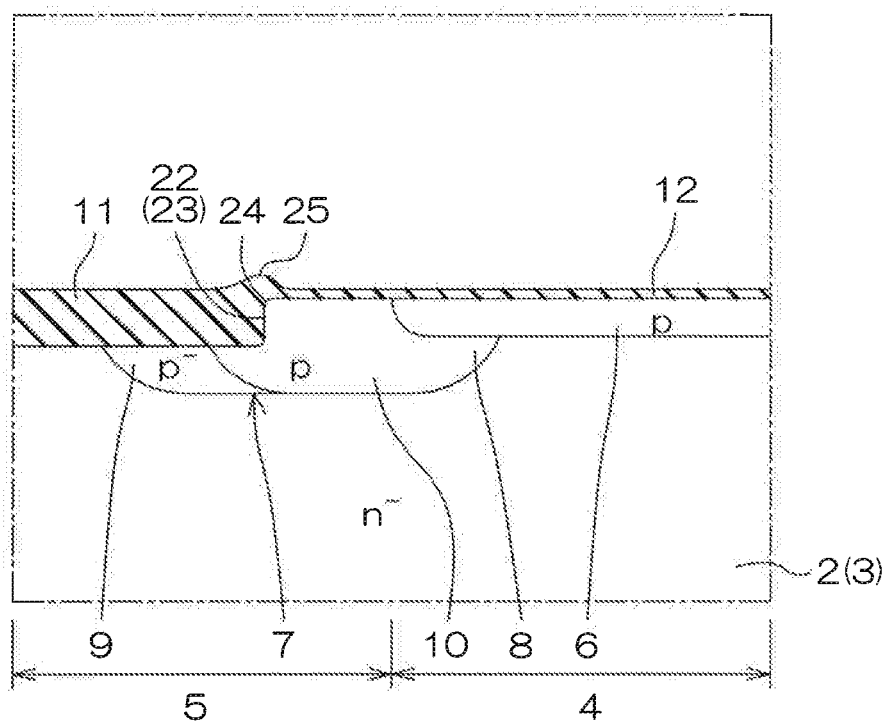

Thereafter, as shown in FIG. 12E, the p type impurity region 6 is formed in the active region 4 (step S6). The semiconductor device 21 is manufactured through the above processes.

Figure 13:
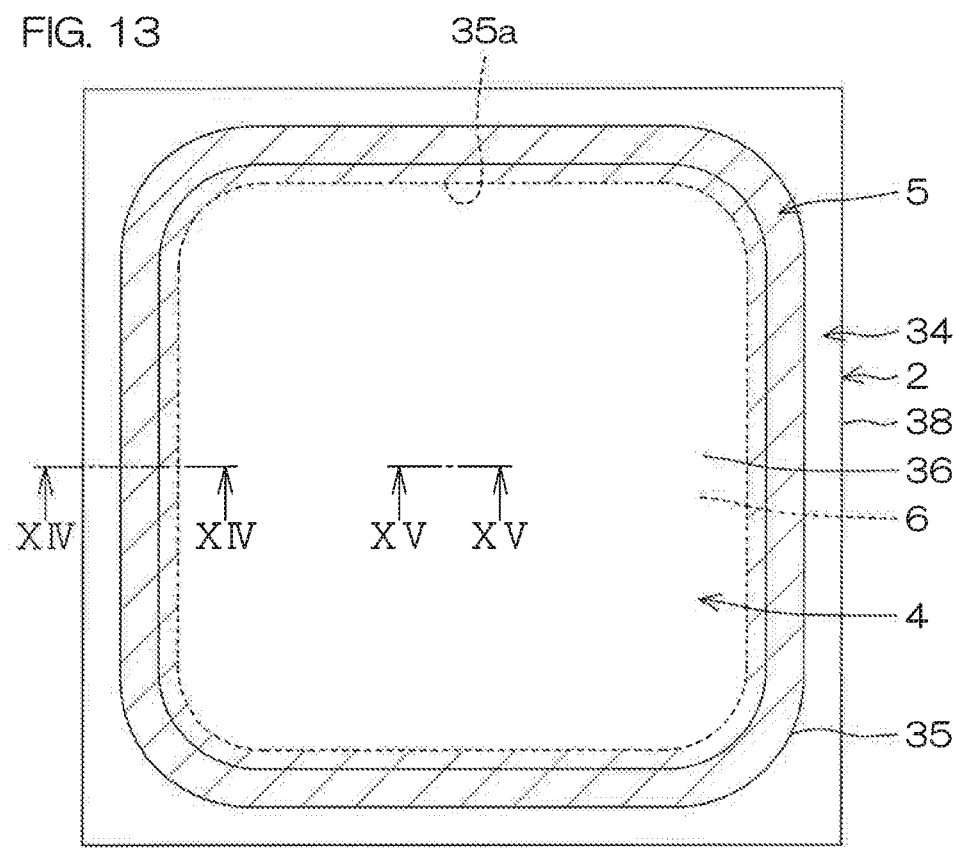
FIG. 13 is a plan view of a semiconductor device according to a third preferred embodiment of the present invention.
Figure 14:
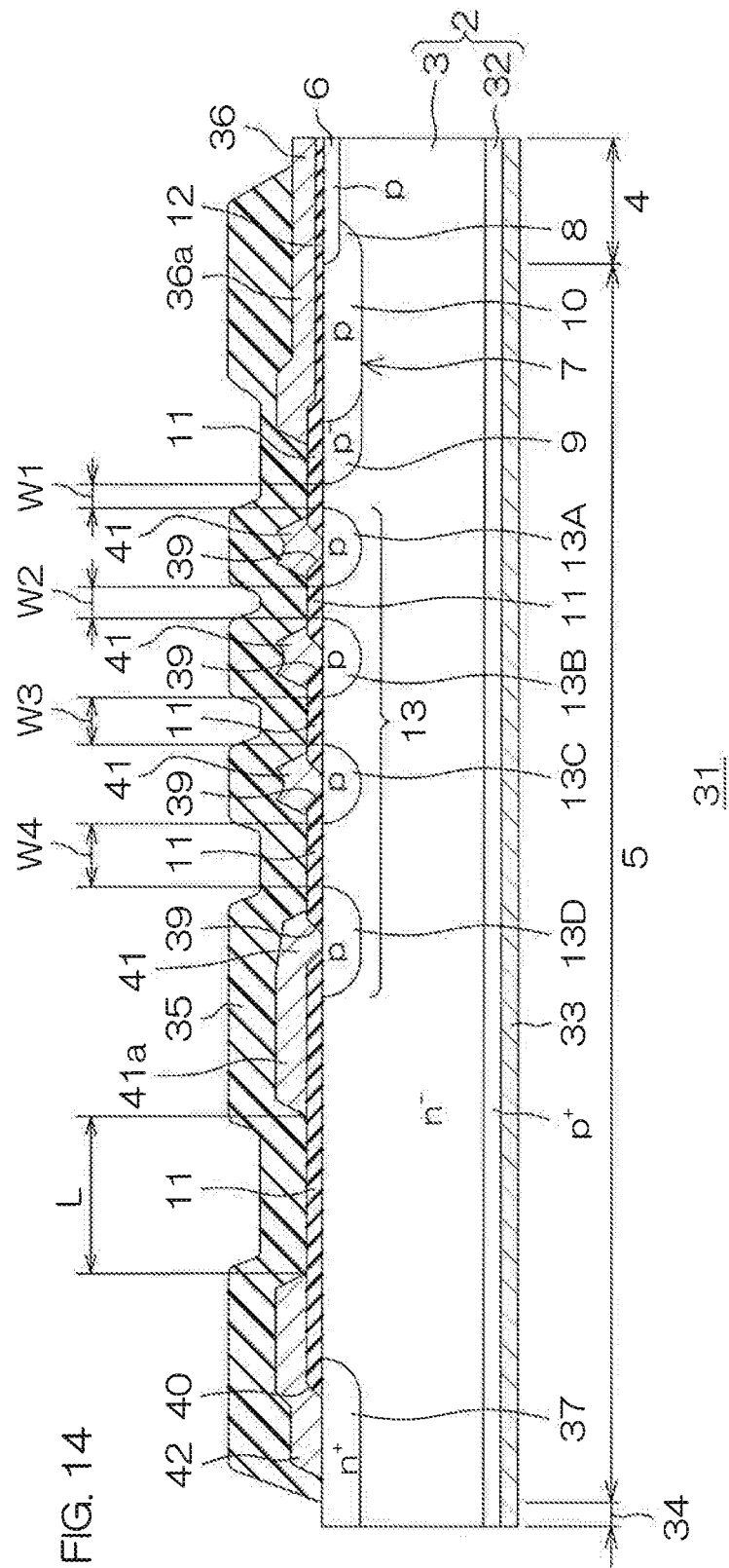
FIG. 14 is a sectional view taken along line XIV-XIV of FIG. 13.

FIG. 13 is a plan view of a semiconductor device 31 according to a third preferred embodiment of the present invention. FIG. 14 is a sectional view taken along line XIV-XIV of FIG. 13. In the present preferred embodiment, arrangements that are the same as the arrangements described in the first preferred embodiment are provided with the same reference symbols and description thereof shall be omitted.

The semiconductor device 31 of the present preferred embodiment is a semiconductor device in which an IGBT (Insulated Gate Bipolar Transistor) is formed as the functional element in the active region 4.

Referring to FIG. 13, a scribe region 34 is set, in addition to the active region 4 and the outer side region 5, in the semiconductor layer 2. The scribe region 34 is set in a region outside the outer side region 5. In the present preferred embodiment, the scribe region 34 is set to an endless shape (quadrilateral annular shape in plan view) that surrounds the outer side region 5 in a region between the peripheral edges of the semiconductor layer 2 and peripheral edges of the outer side region 5.

A front surface protective film 35 is formed above the front surface of the semiconductor layer 2. In FIG. 13, the front surface protective film 35 is indicated by hatching. The front surface protective film 35 selectively covers the active region 4 and the outer side region 5 so as to expose the scribe region 34. An emitter electrode 36 (described below) as a front surface electrode is formed on the semiconductor layer 2. A pad opening 35a exposing a part of the emitter electrode 36 as a pad electrode is formed in the front surface protective film 35.

Referring to FIG. 14, the n type impurity region 3 is formed at the front surface side of the semiconductor layer 2. A p$^+$ type impurity region 32 is formed at the rear surface side of the semiconductor layer 2. A collector electrode 33 is formed on the rear surface of the semiconductor layer 2. The collector electrode 33 is electrically connected to the p$^+$ type impurity region 32.

The p type impurity region 6 is formed at the surface layer portion of the semiconductor layer 2 in the active region 4. Also, the p type well region 7 is formed at the surface layer portion of the semiconductor layer 2 in the outer side region 5. The p type impurity region 6 and the p type well region 7 are both formed in the same manner as in the first preferred embodiment described above.

Referring to FIG. 14, at the surface layer portion of the semiconductor layer 2 in the outer side region 5, a plurality (four, in the present preferred embodiment) of the p type FLR regions 13 are formed so as to surround the p type well region 7. In the present preferred embodiment, the plurality of p type FLR regions 13 include p type FLR regions 13A, 13B, 13C, and 13D that are formed in that order at intervals from the p type well region 7 toward the scribe region 34.

In the present preferred embodiment, the p type FLR regions 13A, 13B, 13C, and 13D are formed such that the intervals W1, W2, W3, and W4 therebetween increase gradually from the active region 4 toward the scribe region 34. The interval W1 is the interval between the innermost p type FLR region 13A and the p type well region 7. For example, the intervals may be such that, approximately, the interval W1=15 μm, the interval W2=17 μm, the interval W3=19 μm, and the interval W4=23 μm.

Referring to FIG. 14, an n$^+$ type channel stop region 37 is formed at the surface layer portion of the semiconductor layer 2 in the outer side region 5. The n$^+$ type channel stop region 37 is formed in a region opposite to the p type well region 7 with respect to the p type FLR regions 13. The n$^+$ type channel stop region 37 is formed at the outside (that is, at a side surface side of the semiconductor layer 2) of and across an interval from the p type FLR region 13.

The n$^+$ type channel stop region 37 is formed in a band shape in plan view that extends along peripheral edges of the p type FLR regions 13. In the present preferred embodiment, the n$^+$ type channel stop region 37 is formed in an endless shape (quadrilateral annular shape in plan view) that surrounds the p type FLR regions 13. The n$^+$ type channel stop region 37 may be formed so as to cross the scribe region 34 and be exposed from side surfaces of the semiconductor layer 2.

The oxide film 11 covers the front surface of the semiconductor layer 2 selectively. More specifically, the oxide film 11 selectively covers the p type well region 7 in the same manner as in the first preferred embodiment described above. Also, the oxide film 11 selectively covers the outer side region 5 so as to expose the scribe region 34.

The oxide film 11 includes contact holes 39 and a removed region 40. The contact holes 39 selectively expose the p type FLR regions 13. The removed region 40 selectively exposes the n$^+$ type channel stop region 37.

Field plates 41 are formed on the oxide film 11 in the outer side region 5. The field plates 41 are connected one by one to each of the p type FLR regions 13A to 13D. The respective field plates 41 are connected to the corresponding p type FLR regions 13A to 13D inside the contact holes 39.

The field plate 41 connected to the outermost positioned p type FLR region 13D may have a lead-out portion 41a that is lead out toward the outer side (that is, the scribe region 34 side) of the semiconductor layer 2 on the oxide film 11.

An EQR (EQui-potential Ring) electrode 42 is further formed on the oxide film 11 in the outer side region 5. The EQR electrode 42 is connected to the n+ type channel stop region 37 in the removed region 40.

An insulation distance L between an outer peripheral edge of the outermost positioned field plate 41 and an inner peripheral edge of the EQR electrode 42 may, for example, be equal to or greater than 30 μm and equal to or less than 60 μm.

Figure 15:
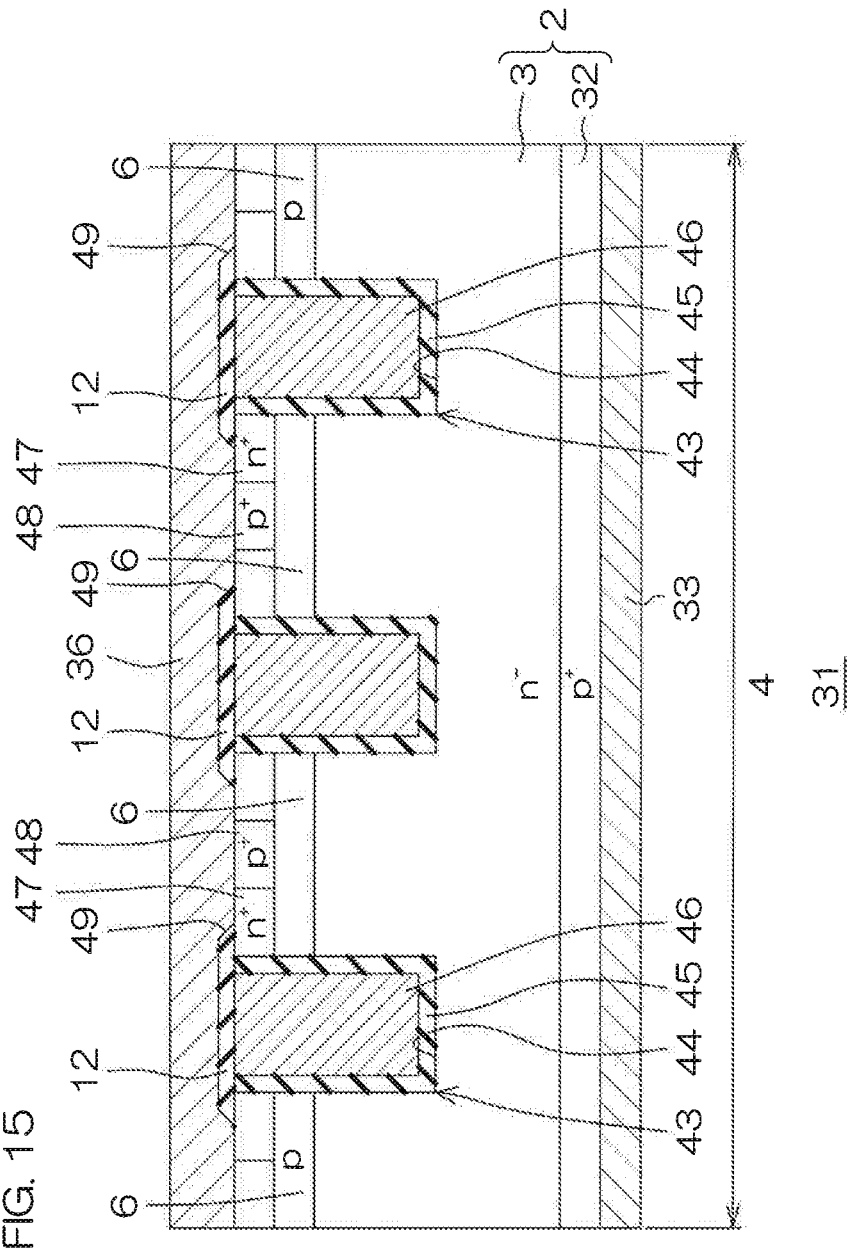
FIG. 15 is a sectional view taken along line XV-XV of FIG. 13.

FIG. 15 is a sectional view taken along line XV-XV of FIG. 13. The dimensions in FIG. 15 are more enlarged than the dimensions in FIG. 14 for convenience of description.

Referring to FIG. 15, the p type impurity region 6, which defines the active region 4, forms a p type body region of the IGBT in the present preferred embodiment. In the active region 4, a plurality of trench gate structures 43 are formed in the front surface of the semiconductor layer 2.

The plurality of trench gate structures 43 are formed, for example, in stripes extending in the same direction in plan view. Each trench gate structure 43 includes a gate trench 44 formed in the front surface of the semiconductor layer 2. Each trench gate structure 43 also includes a gate electrode 46 that is embedded in the gate trench 44 with an insulating film 45 interposed therebetween.

In a region between mutually adjacent trench gate structures 43, the p type impurity region 6 is shared by one trench gate structure 43 and the other trench gate structure 43. At sides of each trench gate structure 43, an n+ type emitter region 47 is formed in a surface layer portion of the p type impurity region 6.

The n+ type emitter region 47, the p type impurity region 6, and the n− type impurity region 3 are thereby formed in this order from the front surface side toward the rear surface side of the semiconductor layer 2 at the sides of each trench gate structure 43. In the p type impurity region 6, each region between the n+ type emitter region 47 and the n− type impurity region 3 is a channel of the IGBT.

Also in surface layer portions of the p type impurity region 6, p+ type contact regions 48 are formed so as to be sandwiched by the n+ type emitter regions 47.

In the present preferred embodiment, the front surface insulating film 12 is also formed on the front surface of the semiconductor layer 2 in the active region 4. The front surface insulating film 12 covers the entirety of the active region 4. The respective trench gate structures 43 are thus covered by the front surface insulating film 12.

Contact holes 49, selectively exposing the n+ type emitter regions 47 and the p+ type contact regions 48, are formed in the front surface insulating film 12. An emitter electrode 36 is formed on the front surface insulating film 12. The emitter electrode 36 is connected to the n+ type emitter regions 47 and the p+ type contact regions 48 inside the contact holes 49.

Referring again to FIG. 14, the emitter electrode 36 may have a lead-out portion 36a that is lead out from the active region 4 to the outer side region 5 on the front surface insulating film 12. The lead-out portion 36a of the emitter electrode 36 may be lead out continuously from above the front surface insulating film 12 to above the oxide film 11. The lead-out portion 36a of the emitter electrode 36 may face the outer side peripheral edge portion 9 of the p type well region 7 across the oxide film 11. The front surface protective film 35 may cover an outer peripheral edge (lead-out portion 36a) of the emitter electrode 36.

As described above, the same effects as the effects described in the first preferred embodiment can be achieved by the semiconductor device 31 of the present preferred embodiment as well.

In the present preferred embodiment, an example where the plurality of p type FLR regions 13A to 13D are formed was described. However, according to the semiconductor device 31 of the present preferred embodiment, an electric field can be relaxed by the outer side peripheral edge portion 9 having the comparatively low p type impurity concentration. The number of the p type FLR regions 13A to 13D can thus be reduced as necessary. A miniaturization of the semiconductor layer 2 can thereby be achieved by reducing the number of the p type FLR regions 13A to 13D.

The arrangement of the second preferred embodiment described above may be combined with the semiconductor device 31 according the present preferred embodiment. That is, a step portion 22 (groove 23) may be formed in a region in the front surface of the semiconductor layer 2 that includes the outer side peripheral edge portion 9 of the p type well region 7.

Although preferred embodiments of the present invention have been described above, the present invention may also be implemented in yet other modes.

The functional element formed in the active region 4 is not restricted to the diode or the IGBT. The functional element may be a passive element, such as a resistor or capacitor, etc., formed using the semiconductor layer 2. The functional element may be a MISFET (Metal Insulator Semiconductor Field Effect Transistor).

If the functional element includes the MISFET, for example, the p+ type impurity region 32 in the third preferred embodiment described above may be inverted in conductivity type and be made an n+ type impurity region. In this case, the arrangement is such that the emitter electrode 36 of the IGBT corresponds to being a source electrode of the MISFET. Also in this case, the arrangement is such that the n+ type emitter region 47 of the IGBT corresponds to being an n+ type source region of the MISFET. Also in this case, the arrangement is such that the collector electrode 33 of the IGBT corresponds to being a drain electrode of the MISFET.

In each of preferred embodiments described above, an example where the semiconductor layer 2 is formed using a semiconductor wafer of an n type Si monocrystal manufactured by the FZ method was described. However, the semiconductor layer 2 may instead have a laminated structure that includes a semiconductor substrate, made of silicon, and an epitaxial layer, formed on the semiconductor substrate. The epitaxial layer may be formed by growing silicon epitaxially from a front surface of the semiconductor substrate.

In the present arrangement, the semiconductor substrate may be an n+ type semiconductor substrate or a p+ type semiconductor substrate. Also, the epitaxial layer may be an n− type epitaxial layer. The semiconductor layer 2 may take on any of various forms in accordance with a function of the functional element formed in the active region 4.

With each of the preferred embodiments described above, an example where boron (B) is adopted as an example of the p type impurity that forms the p type well region 7 was described. However, the p type impurity forming the p type well region 7 is not restricted to boron (B). For example, any p type impurity is appropriate for forming the p type well region 7 as long as it is a p type impurity that can be absorbed by the oxide film 11 during the process of forming the oxide film 11 (step S5).

In each of the preferred embodiments described above, an arrangement in which the conductivity types of the respective semiconductor portions are inverted may be adopted. That is, a p type portion may be of an n type and an n type portion may be of a p type.

In each of the preferred embodiments described above, an example where the p type impurity region 6 and the p type well region 7 are formed separately was described. However, an arrangement such as shown in FIG. 16 may be adopted instead.

Figure 16:
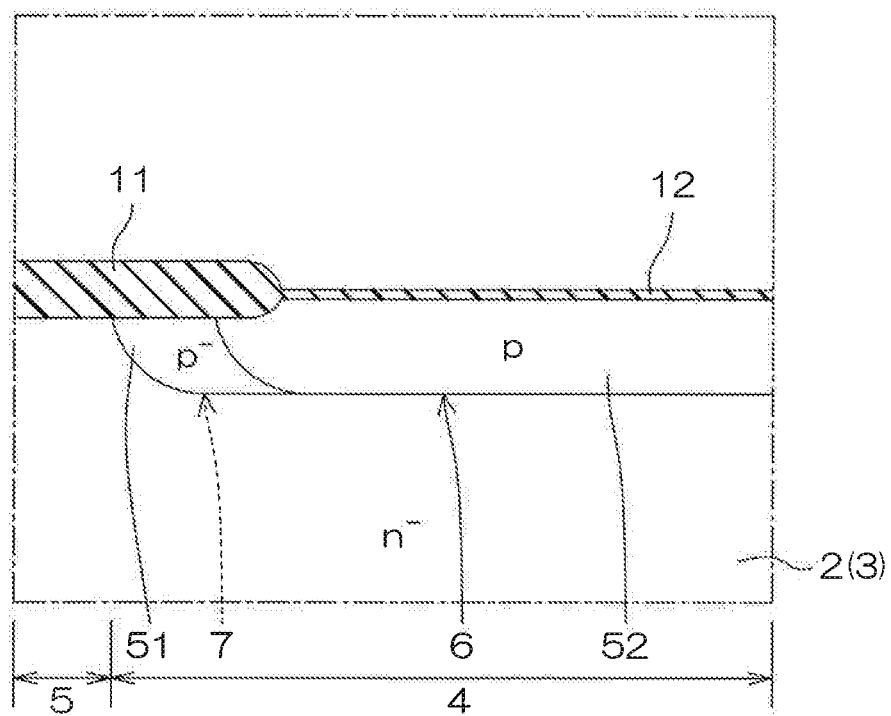
FIG. 16 is a sectional view of another configuration of a p type impurity region and a p type well region.

FIG. 16 is a sectional view of another configuration of the p type impurity region 6 and the p type well region 7. In FIG. 16, arrangements that are the same as the arrangements described in the first preferred embodiment are provided with the same reference symbols and description thereof shall be omitted.

In the configuration of FIG. 16, the p type well region 7 is formed integral to the p type impurity region 6 in the surface layer portion of the semiconductor layer 2 in the active region 4. That is, the p type impurity region 6 has a structure where the p type impurity concentration of a peripheral edge portion 51 positioned at the outer side region 5 side is lower than the p type impurity concentration of an inner portion 52.

The relationship of the p type impurity concentration of the peripheral edge portion 51 with respect to the inner portion 52 of the p type impurity region 6 is the same as the relationship of the p type impurity concentration of the outer side peripheral edge portion 9 with respect to the inner side peripheral edge portion 8 (inner portion 10) of the p type well region 7 described with the first preferred embodiment.

According to such an arrangement, the occurrence of electric field concentration with respect to the peripheral edge portion 51 of the p type impurity region 6 can be also suppressed.

Examples of features extracted from the present specification and drawings are indicated below.

[Clause 1] A semiconductor device including, a semiconductor layer, a first impurity region of a first conductivity type, formed at a surface layer portion of the semiconductor layer, a second impurity region of a second conductivity type, formed at a surface layer portion of the first impurity region and defining an active region, and a well region of the second conductivity type, formed along a periphery of the second impurity region at a surface layer portion of the first impurity region and having an inner side edge portion, positioned at the second impurity region side, and an outer side edge portion, positioned at an opposite side with respect to the second impurity region, wherein a step portion, which is depressed in a depth direction from a surface of the semiconductor layer, is formed in a region that includes the outer side edge portion of the well region in the surface of the semiconductor layer, and a second conductivity type impurity concentration of a surface side of the outer side edge portion that is exposed from the step portion is lower than a second conductivity type impurity concentration of a surface side of the inner side edge portion that is exposed from the surface of the semiconductor layer in the well region.

According to the semiconductor device, the second conductivity type well region having a structure where the second conductivity type impurity concentration of the surface side of the outer side edge portion that is exposed from the step portion is lower than the second conductivity type impurity concentration of the surface side of the inner side edge portion that is exposed from the surface of the semiconductor layer, is formed. An electric field concentration to the outer side edge portion of the second conductivity type well region can thereby be suppressed. A semiconductor device having a structure enabling improvement of the withstand voltage can thus be provided.

[Clause 2] The semiconductor device according to Clause 1, wherein a bottom portion of the outer side edge portion of the well region is formed at a position of equal depth as a bottom portion of the inner side edge portion of the well region.

[Clause 3] The semiconductor device according to Clause 1 or 2, wherein the inner side edge portion includes, an intermediate portion that is positioned on the same plane as a surface of the outer side edge portion in an intermediate portion in a depth direction of the well region, and the second conductivity type impurity concentration of the surface of the outer side edge portion is lower than a second conductivity type impurity concentration of the intermediate portion of the inner side edge portion.

[Clause 4] The semiconductor device according to any one of Clauses 1 to 3, wherein the well region has a concentration profile where the second conductivity type impurity concentration decreases gradually from the inner side edge portion toward the outer side edge portion.

[Clause 5] The semiconductor device according to any one of Clauses 1 to 4, wherein the well region has a concentration profile where the second conductivity type impurity concentration decreases gradually in the depth direction from the surface of the semiconductor layer.

[Clause 6] The semiconductor device according to any one of Clauses 1 to 5, wherein the step portion has a step surface, connecting the surface of the semiconductor layer and a surface of the outer side edge portion, and an insulating film, covering the surface of the outer side edge portion and the step surface of the step portion, is further formed.

[Clause 7] The semiconductor device according to Clause 6, wherein the insulating film is an oxide film.

[Clause 8] The semiconductor device according to any one of Clauses 1 to 7, wherein the first conductivity type is an n type, the second conductivity type is a p type, and the well region includes boron as a p type impurity.

[Clause 9] A method for manufacturing a semiconductor device, including a step of preparing a semiconductor layer, having a first impurity region of a first conductivity type formed at a surface layer portion, a step of setting an active region, in which a functional element is to be formed, in the semiconductor layer and introducing a second conductivity type impurity in a surface layer portion of the first impurity region so that the second conductivity type impurity is introduced along a peripheral edge of the active region to form a well region of the second conductivity type, a step of selectively removing a region, including an outer side edge portion positioned at an opposite side with respect to the active region in the well region, from the semiconductor layer so that a portion of the outer side edge portion remains, and a step of introducing a second conductivity type impurity in the surface layer portion of the first impurity region in the active region to form a second impurity region of the second conductivity type that defines the active region.

The present application corresponds to Japanese Patent Application No. 2016-71829 filed in the Japan Patent Office on Mar. 31, 2016, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

What is claimed is:

1. A semiconductor device comprising:
a semiconductor layer of a first conductivity type having a main surface;
an active region that is formed at an inner region in the main surface of the semiconductor layer and in which a functional element is formed;
an outer side region that is formed outside the active region in the main surface of the semiconductor layer;
a semiconductor region of a second conductivity type having a second conductivity type impurity concentration greater than the first conductivity type impurity concentration of the semiconductor layer of the first conductivity type, the semiconductor region of the second conductivity type formed in a surface layer portion of the main surface of the semiconductor layer along a periphery of the active region so as to define the active region and having an inner side edge portion positioned at the active region side and an outer side edge portion positioned at an opposite side with respect to the active region;
an insulating film selectively covering the main surface of the semiconductor layer at the outer side region;
a protective film extending on the outer side region from the active region so as to cover the insulating film, the protective film formed at an interval from an end of the semiconductor layer so as to expose an end portion of the main surface of the semiconductor layer, the protective film having a thickness greater than a thickness of the insulating film; and
an electrode that has a first portion interposed between the main surface of the semiconductor layer and the protective film so as to be connected to the main surface of the semiconductor layer and the protective film and a second portion interposed between the insulating film and the protective film so as to be connected to the insulating film and the protective film.

2. The semiconductor device according to claim 1, wherein the protective film has a portion connected to the insulating film.

3. The semiconductor device according to claim 1, wherein the protective film has a portion connected to the semiconductor layer.

4. The semiconductor device according to claim 1, wherein insulating film is formed at an interval from the end of the semiconductor layer.

5. The semiconductor device according to claim 1, wherein the outer side edge portion of the semiconductor region has a second conductivity type impurity concentration lower than a second conductivity type impurity concentration of the inner side edge portion.

6. The semiconductor device according to claim 1, wherein the semiconductor region has a concentration profile where a second conductivity type impurity concentration decreases gradually from the inner side edge portion to the outer side edge portion.

7. The semiconductor device according to claim 1, wherein the semiconductor region has a concentration profile where a second conductivity type impurity concentration decreases gradually in a depth direction from the surface of the semiconductor layer.

8. The semiconductor device according to claim 1, wherein the outer side edge portion and the inner side edge portion of the semiconductor region are formed in an equal depth.

9. The semiconductor device according to claim 1,
wherein the insulating film covers the outer side edge portion of the semiconductor region and exposes the inner side edge portion of the semiconductor region, and
the protective film faces the outer side edge portion of the semiconductor region across the insulating film.

10. The semiconductor device according to claim 9, wherein a second conductivity type impurity concentration of the outer side edge portion covered by the insulating film is lower than a second conductivity type impurity concentration of the inner side edge portion exposed from the insulating film in the semiconductor region.

11. The semiconductor device according to claim 9, wherein a portion covering the outer side edge portion of the semiconductor region in the insulating film contains a second conductivity type impurity of the same type as a second conductivity type impurity contained in the semiconductor region.

12. The semiconductor device according to claim 1, further comprising:
an impurity region of a second conductivity type formed in the surface layer portion of the semiconductor layer at the active region.

13. The semiconductor device according to claim 12, wherein the inner side edge portion of the semiconductor region is connected to the impurity region.

14. The semiconductor device according to claim 12, wherein the semiconductor region surrounds the impurity region.

15. The semiconductor device according to claim 1, further comprising:
a field limiting region of a second conductivity type formed in the surface layer portion of the semiconductor layer separated from the semiconductor region at the outer side region.

16. The semiconductor device according to claim 1, further comprising:
a surface insulating film covering the surface of the semiconductor layer at the active region side with respect to the insulating film and having a thickness smaller than a thickness of the insulating film.

17. The semiconductor device according to claim 1, further comprising:
a back surface electrode formed on a back surface on an opposite side of the main surface of the semiconductor layer.

18. The semiconductor device according to claim 1, wherein the functional element includes a Diode, a MISFET or an IGBT.

19. The semiconductor device according to claim 1, wherein the insulating film is made of an inorganic material, and the protective film is made of an organic material.

20. The semiconductor device according to claim 1, wherein the insulating film is made of a LOCOS film.

21. The semiconductor device according to claim 1, wherein a step portion, which is depressed in a thickness direction from the main surface of the semiconductor layer, is formed in a region that includes the outer side edge portion of the semiconductor region in the main surface of the semiconductor layer.

* * * * *